United States Patent
Masuda et al.

(10) Patent No.: US 7,525,129 B2
(45) Date of Patent: Apr. 28, 2009

(54) ORGANIC LIGHT-EMITTING DISPLAY

(75) Inventors: Kazuhito Masuda, Hitachi (JP); Shingo Ishihara, Yonezawa (JP); Sukekazu Aratani, Hitachiota (JP); Masaya Adachi, Hitachi (JP)

(73) Assignee: Hitachi Displays, Ltd., Chiba (JP)

( * ) Notice: Subject to any disclaimer, the term of this patent is extended or adjusted under 35 U.S.C. 154(b) by 185 days.

(21) Appl. No.: 11/079,643

(22) Filed: Mar. 14, 2005

(65) Prior Publication Data
US 2005/0206305 A1 Sep. 22, 2005

(30) Foreign Application Priority Data
Mar. 18, 2004 (JP) ............... 2004-077370

(51) Int. Cl.
*H01J 1/62* (2006.01)
(52) U.S. Cl. ............... 257/103; 257/40; 257/77; 257/96; 257/E51.043; 257/E51.051; 257/E51.03; 257/E51.036; 257/E51.049
(58) Field of Classification Search ............ 257/96, 257/103, 77, 40
See application file for complete search history.

(56) References Cited

U.S. PATENT DOCUMENTS

| | | | | |
|---|---|---|---|---|
| 5,053,679 | A * | 10/1991 | Thioulouse | 315/169.3 |
| 5,667,607 | A * | 9/1997 | Sugiura et al. | 156/67 |
| 6,545,408 | B2 | 4/2003 | Uchida et al. | |
| 2001/0020818 | A1 * | 9/2001 | Uchida et al. | 313/504 |
| 2003/0170491 | A1 * | 9/2003 | Liao et al. | 428/690 |
| 2003/0189401 | A1 | 10/2003 | Kido et al. | |
| 2005/0242346 | A1 * | 11/2005 | Forrest et al. | 257/40 |
| 2006/0227079 | A1 * | 10/2006 | Kashiwabara | 345/76 |
| 2007/0182317 | A1 | 8/2007 | Kido et al. | |
| 2008/0248191 | A1 * | 10/2008 | Daniels | 427/66 |

FOREIGN PATENT DOCUMENTS

| | | |
|---|---|---|
| JP | A-7-142169 | 6/1995 |
| JP | A-2002-260859 | 9/2002 |
| JP | A-2003-229260 | 8/2003 |
| JP | 2003-272860 | 9/2003 |
| JP | A-2003-272860 | 9/2003 |
| JP | A-2004-63349 | 2/2004 |

OTHER PUBLICATIONS

Japanese language office action for corresponding Japanese application No. 2004-077370 list the references above.

* cited by examiner

*Primary Examiner*—A. Sefer
(74) *Attorney, Agent, or Firm*—Hogan & Hartson LLP

(57) ABSTRACT

It is an object of the present invention to provide an organic light-emitting display of high light-emitting efficiency. The organic light-emitting element comprising a board, upper electrode, lower electrode, a plurality of light-emitting units placed between the upper and lower electrodes, and a charge-generating layer placed between a plurality of the light-emitting units, wherein one of the light-emitting units has a layer for emitting monochromatic light and one of the light-emitting units has a layer for emitting polychromatic light, the former unit having an equivalent or lower light-emitting efficiency than the latter unit.

7 Claims, 6 Drawing Sheets

ORGANIC LIGHT-EMITTING DISPLAY

FIELD OF THE INVENTION

The present invention relates to an organic light-emitting display.

BACKGROUND OF THE INVENTION

Recently, organic light-emitting displays have been attracting attention as planar displays of the next generation. These organic light-emitting displays have excellent characteristics, e.g., capacity of emitting white light, wide viewing angle and high-speed response.

An organic electroluminescent element (hereinafter referred to as organic EL element) disclosed by JP-A-2003-272860 is known. FIG. 2 illustrates a conventional organic EL element. It comprises the board 1 which supports the lower electrode 2 and upper electrode 6, and light-emitting unit 7, charge-generating layer 4-1, light-emitting unit 8, charge-generating layer 4-2, light-emitting unit 9, charge-generating layer 4-3 which are placed between these electrodes 2 and 6. The light-emitting units 7, 8 and 9 are responsible for emitting red, green and blue light, respectively. The conventional organic EL element illustrated in FIG. 2 has a layered structure comprising the light-emitting units connected to each other in series via the charge-generating layer in-between. The light-emitting units 7, 8 and 9 emit red, green and blue light, respectively, when a voltage is applied to between the lower electrode 2 and upper electrode 6. These light colors overlap each other to produce white light. Luminance L of white light emitted by the organic EL element illustrated in FIG. 2 can be given by the formula L=LR+LG+LB, where LR, LG and LB are each luminance of red, green and blue light emitted by the light-emitting units 7, 8 and 9. Luminance L of white light emitted by the organic EL element illustrated in FIG. 2 can be also given by the formula L=I$\alpha$R+I$\alpha$G+I$\alpha$B, where $\alpha$R, $\alpha$G and $\alpha$B are each light-emitting efficiency (current efficiency) of the respective light-emitting units 7, 8 and 9, and I is current passing through each of the these light-emitting units. Luminance L of white color emitted by the organic EL element illustrated in FIG. 2 is proportional to light-emitting efficiency of each light-emitting unit. In other words, the R/G/B luminance ratio is equal to $\alpha$R/$\alpha$G/$\alpha$B.

(Patent Document 1) JP-A-2003-272860

BRIEF SUMMARY OF THE INVENTION

An R (red)/G (green)/B (blue) luminance ratio for producing white light is commonly 1/2/1. The light colors in a common organic EL element are green, blue and red arranged in the descending order of easiness of giving a high light-emitting efficiency, red being the most difficult to secure a high efficiency. The light-emitting efficiency means current efficiency (cd/A).

Luminance of the red, green and blue light emitted by the organic EL element illustrated in FIG. 2 is proportional to the light-emitting efficiency of the respective light-emitting unit. When the red, green and blue light colors have a luminance of 3 cd/A, 12 cd/A and 6 cd/A, respectively, the luminance ratio R/B/G of the organic EL element illustrated in FIG. 2 will be 3/12/6. The light-emitting efficiency is determined by that of the light-emitting unit of the lowest efficiency for the organic EL element to emit white light having the common R/B/G luminance ratio of 1/2/1. In other words, the organic EL element illustrated in FIG. 2 cannot emit white light of common R/B/G luminance ratio of 1/2/1 unless the R/B/G light-emitting units are designed to have a luminance ratio of 3/6/3. In other words, light-emitting efficiency of the green-emitting unit in the conventional organic EL element illustrated in FIG. 2 should be decreased from 12 to 6 cd/A, and so is from 6 to 3 cd for the blue-emitting unit. Therefore, the conventional organic EL element illustrated in FIG. 2 involves a problem of lower light-emitting efficiency than that it can potentially exhibit. It is a technical theme of the present invention to provide an organic light-emitting display of high light-emitting efficiency.

The present invention relates to an organic light-emitting element comprising a board which supports an upper and lower electrodes, and a plurality of light-emitting units and a charge-generating layer placed between these electrodes, wherein the charge-generating layer is placed between the light-emitting units and is composed of an electrically insulating layer having a resistivity of $1.0 \times 10^2 \Omega \cdot cm$ or more, and said plurality of the light-emitting units comprise a monochromatic light-emitting unit having a layer for emitting monochromatic light and a polychromatic light-emitting unit having a layer for emitting polychromatic light. The present invention also relates to an organic light-emitting display which comprises a plurality of the above-described organic light-emitting elements and controls light-emitting operation of these elements.

The charge-generating layer is an electrically insulating layer having a resistivity of $1.0 \times 10^2 \Omega \cdot cm$ or more, preferably $1.0 \times 10^5 \cdot cm$ or more. When energized, it works to inject holes towards the cathode and electrons towards the anode, to actually provide the electrical circuit which electrically connects the light-emitting units to each other in series. The preferable materials for the charge-generating layer include $V_2O_5$ (vanadium pentaoxide) and an aryl amine compound.

The upper and lower electrodes constitute a pair of the electrodes which hold the light-emitting units in-between, where the lower electrode is provided between the board and light-emitting unit, and the upper electrode is provided on the light-emitting unit on the other side of the board.

In an organic EL element structure which emits light from the upper electrode, the upper electrode works as the anode and lower electrode as the cathode. In a structure which emits light from the lower electrode, on the other hand, the upper electrode works as the cathode and lower electrode as the anode.

The anode in the above structure is preferably in the form of electroconductive film of high work function, which enhances hole injection efficiency. Specifically, the materials for the anode include, but not limited to, gold and platinum. Moreover, the anode may be of a two-element system including indium tin oxide (ITO), indium zinc oxide (IZO) or indium germanium oxide, or three-element system including indium tin zinc oxide. The composition may be composed of tin oxide or zinc oxide as the major component, instead of indium oxide. When ITO is used, the widely used composition includes tin oxide at 5 to 10% by weight on indium oxide. The oxide semiconductor may be produced by sputtering, EB vapor deposition, ion plating or the like. A transparent electroconductive film of $In_2O_3$—$SnO_2$— or $In_2O_3$—ZnO-based composition has a work function of 4.6 eV, which can be increased to 5.2 eV or so when it is treated with UV, ozone or oxygen plasma. A transparent, electroconductive film based on $In_2O_3$—$SnO_2$ will be polycrystalline, when produced by sputtering with the board heated to around 200° C. The polycrystalline film may have irregularities on the surface due to the grains, and is preferably surface-polished. Alternately, the film is preferably produced in an amorphous state, and heated into a polycrystalline state. The anode may be of a common electroconductive film, when the above-described hole injection layer is provided, because it no longer needs a material of high work function. More specifically, the materials useful for the anode include metals, e.g., aluminum, indium, molybdenum, nickel and an alloy thereof; and inorganic materials, e.g., polysilicon, amorphous silicon, tin oxide, indium oxide and, indium tin oxide (ITO). The other preferable materials include organic materials, e.g., polyaniline and polythiophene; and electroconductive ink, which can be formed by a simple process of spreading. The preferable materials are not limited to the above, needless to say. They may be used either individually or in combination.

The light-emitting unit has one or more light-emitting layers between the hole injection and transport layers, and electron injection and transport layers, which are assembled to have a unit. The hole transport layer is preferably made of a material having an adequate ionization potential to reduce an injection barrier at the anode and hole transport layer. Moreover, it preferably works to smooth rough base layer surfaces. Specifically, the preferable materials for the hole transport layer include, but not limited to, copper phthalocyanine, starburst amine compound, polyaniline, polythiophene, vanadium oxide, molybdenum oxide, ruthenium oxide and aluminum oxide. The hole injection layer works to transport holes and inject them into the light-emitting layer. Therefore, it preferably has a high hole mobility. Moreover, it is preferably chemically stable and low in ionization potential. The other characteristics it preferably has include low electron affinity and high glass transition temperature. Specifically, the preferable materials include N,N'-bis(3-methylphenyl)-N,N'-diphenyl-[1,1'-biphenyl]-4,4'-diamine (TPD), 4,4'-bis[N-(1-naphthyl)-N-phenylamino]biphenyl ($\alpha$-NPD), 4,4',4"-tri(N-carbazolyl)triphenylamine (TCTA) and 1,3,5-tris[N-(4-diphenylaminophenyl)phenylamino]benzene (p-DPA-TDAB). The preferable materials are not limited to the above, needless to say. They may be used either individually or in combination.

The light-emitting layer is the layer in which the injected holes and electrons are recombined each other to emit light of a wavelength specific to a material. Light may be emitted by a host material per se for the light-emitting layer, or by a trace quantity of dopant incorporated in the host material. Specifically, the preferable materials for the layer include a distyrylarylene derivative (DPVBi), silole derivative with one or more benzene rings in the skeleton (2PSP), oxodiazole derivative with triphenylamine structures at both terminals (EM2), perinone derivative with phenanthlene group (P1), oligothiophene derivative with triphenylamine structures at both terminals (BMA-3T), perylene derivative (tBu-PTC), tris(8-quinolinol)aluminum, polyparaphenylene-vinylene derivative, polythiophene derivative, polyparaphenylene derivative, polysilane derivative and polyacetylene derivative. The preferable materials are not limited to the above, needless to say. They may be used either individually or in combination. Specifically, the preferable dopant materials include quinacridone, coumarin 6, Nile Red, rubrene, 4-(dicyanomethylene)-2-methyl-6-(para -dimethylaminostyryl)-4H-pyran (DCM) and a dicarbazole derivative. The preferable materials are not limited to the above, needless to say. They may be used either individually or in combination.

The monochromatic light-emitting element is the unit comprising one light-emitting layer, and polychromatic light-emitting unit is the one comprising 2 or more light-emitting layers.

The electron transport layer works to transport electrons and inject them into the light-emitting layer. Therefore, it preferably has a high electron mobility. Specifically, the preferable materials for the layer include tris(8-quinolinol)aluminum, a oxadiazole derivative, silole derivative and zinc benzothiazole complex. The preferable materials are not limited to the above, needless to say. They may be used either individually or in combination.

The electron injection layer is used to enhance efficiency of injecting electrons from the cathode into the electron transport layer. Specifically, the preferable materials for the layer include lithium fluoride, magnesium fluoride, calcium fluoride, strontium fluoride, barium fluoride, magnesium oxide and aluminum oxide. The preferable materials are not limited to the above, needless to say. They may be used either individually or in combination.

The cathode is preferably in the form of electroconductive film of low work function, which enhances electron injection efficiency. Specifically, the materials for the anode include, but not limited to, a magnesium/silver alloy, aluminum/lithium alloy, aluminum/calcium alloy, aluminum/magnesium alloy and metallic calcium. The cathode generally used comprises codeposited aluminum (Al) and lithium fluoride (LiF), or LiF and Al deposited in this order on the electron transport layer.

In the above structure, each of the two light-emitting units separated by the charge-generating layer works as an electrical circuit, and the sum of current flowing through the two light-emitting layers for the dichromatic light-emitting unit flows through the light-emitting layer for the monochromatic light-emitting unit. Therefore, current flows through the light-emitting layer of lower light-emitting efficiency for the monochromatic light-emitting unit in a larger quantity than that flowing through the two light-emitting layers for the dichromatic light-emitting unit, and consequently the light-emitting layer for the monochromatic light-emitting unit can have a higher luminance. As a result, the structure can give a higher efficiency for the organic EL element and organic light-emitting display.

In another embodiment of the organic light-emitting element of the present invention, the monochromatic light-emitting unit has an equivalent or lower light-emitting efficiency than the polychromatic light-emitting unit.

In still another embodiment of the present invention, the monochromatic light-emitting unit has a red-emitting layer of a singlet material, and the polychromatic light-emitting unit has a green-emitting layer and blue-emitting layer each of a singlet material. The singlet materials for the red-emitting layer include, but not limited to, tris(8-quinolinol)aluminum and Nile Red codeposited to form a film. The singlet materials for the green-emitting layer include, but not limited to, tris(8-quinolinol)aluminum and quinacridone codeposited to form a film. The singlet materials for the blue-emitting layer include, but not limited to, a distyrylarylene derivative deposited to form a film.

In still another embodiment of the present invention, the monochromatic light-emitting unit has a blue-emitting layer of a singlet material, and the polychromatic light-emitting unit has a green-emitting layer and blue-emitting layer each of a triplet material. The singlet materials for the blue-emitting layer include, but not limited to, a distyrylarylene derivative deposited to form a film. The triplet materials for the red-emitting layer include, but not limited to, CBP and PtOEP codeposited to form a film. The triplet materials for the green-emitting layer include, but not limited to, CBP and an iridium complex (Ir(ppy)$_3$) codeposited to form a film.

In still another embodiment of the present invention, the monochromatic light-emitting unit has a blue-emitting layer of a singlet material, and the polychromatic light-emitting unit has a red-emitting layer of a triplet material and green-emitting layers, each of a triplet material, one emitting light having a peak emitted light wavelength of 500 nm and the other emitting light having a peak emitted light wavelength of 540 nm.

The singlet materials for the blue-emitting layer include, but not limited to, a distyrylarylene derivative deposited to form a film. The triplet materials for the red-emitting layer include, but not limited to, CBP and PtOEP codeposited to form a film. The triplet materials for the green-emitting layer emitting light having a peak emitted light wavelength of 500 nm include, but not limited to, CBP and an iridium complex $(Ir(ppy)_3)$, adjusted to have a peak emitted light wavelength of 500 nm and codeposited to form a film. The triplet materials for the green-emitting layer emitting light having a peak emitted light wavelength of 540 nm include, but not limited to, CBP and an iridium complex $(Ir(ppy)_3)$, adjusted to have a peak emitted light wavelength of 540 nm and codeposited to form a film.

In an embodiment of the organic light-emitting display of the present invention, the 2 or more light-emitting layers in the polychromatic light-emitting unit are of layered structure.

In another embodiment of the organic light-emitting display of the present invention, the 2 or more light-emitting layers in the polychromatic light-emitting unit are of layered structure, or arranged almost in parallel to the upper and lower electrodes.

In still another embodiment of the organic light-emitting display of the present invention, a color filter is provided on the side from which light is emitted.

In still another embodiment of the organic light-emitting display of the present invention, a fluorescent material which converts white light into red light, another fluorescent material which converts white light into green light and color filter which selectively transmits blue color in white color are provided on the side from which light is emitted.

In still another embodiment of the organic light-emitting display of the present invention, a function for illumination by using of a light emitted from the organic light-emitting element is provided.

In still another embodiment of the organic light-emitting display of the present invention, a function as a back light for a liquid-crystal display by using of a light emitted from the organic light-emitting element is provided.

Other objects, features and advantages of the invention will become apparent from the following description of the embodiments of the invention taken in conjunction with the accompanying drawings.

DESCRIPTION OF REFERENCE NUMERALS

Figure 1:
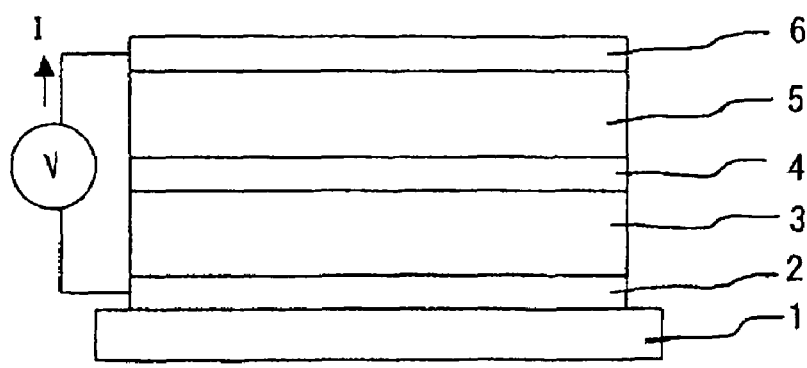
FIG. 1 is a cross-sectional view of the organic light-emitting element prepared in EXAMPLE 1 as one embodiment of the present invention.
Figure 2:
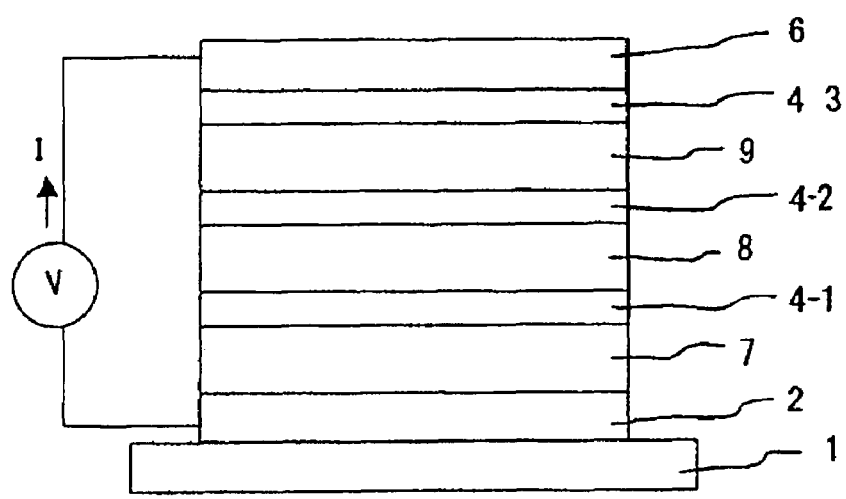
FIG. 2 is a cross-sectional view of an organic light-emitting element prepared by a conventional technique.

1 Board
2 Lower Electrode
3, 5, 7, 8, 9 Light-emitting unit
4, 4-1, 4-2, 4-3 Charge-generating layer
6 Upper electrode
10, 14 Hole transport layer
11 Blue-emitting layer
12 Green-emitting layer
13, 16 Electron transport layer
15 Red-emitting layer
17, 19, 20 Green-emitting layer of a triplet material (phosphorescence-emitting material)
18 Red-emitting layer of a triplet material (phosphorescence-emitting material)
21 Color filter
22, 23, 24 Organic light-emitting element prepared in each of EXAMPLES 1, 3, 5 and 7
25, 26, 27 Organic light-emitting element prepared in each of EXAMPLES 2, 4, 6 and 8
28 Color-converting fluorescent material
29 Black matrix
30 Transparent seal plate
31 Thin-film transistor

DETAILED DESCRIPTION OF THE INVENTION

The present invention is described by EXAMPLES.

EXAMPLE 1

The embodiment of EXAMPLE 1 is described by referring to the drawings.

Figure 3:
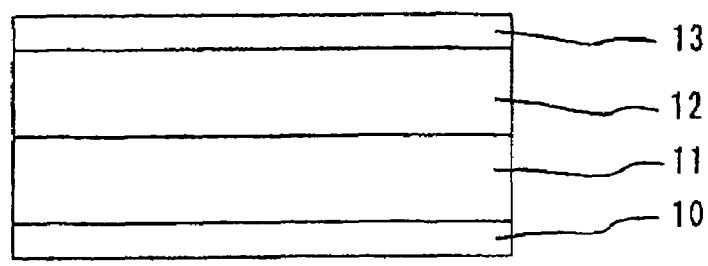
FIG. 3 is a cross-sectional view of the light-emitting unit 3 for the organic light-emitting element prepared in EXAMPLE 1.
Figure 4:
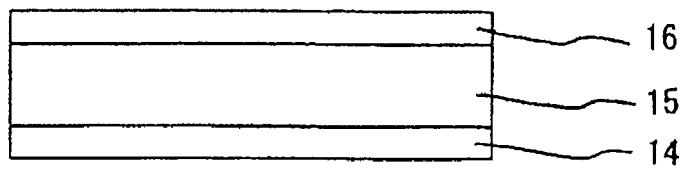
FIG. 4 is a cross-sectional view of the light-emitting unit 5 for the organic light-emitting element prepared in EXAMPLE 1.

This embodiment relates to an organic light-emitting element, illustrated in FIG. 1, structured to emit light from the lower electrode side, and is described by referring to FIGS. 1, 3 and 4. FIG. 1 is a cross-sectional view of the organic light-emitting element of this embodiment. Referring to FIG. 1, the organic light-emitting element comprises the board 1 which supports the lower electrode 2, light-emitting unit 3, charge-generating layer 4, light-emitting unit 5 and upper electrode 6, wherein the charge-generating layer 4 is provided between the light-emitting units 3 and 5.

The board 1 can be made of a transparent material, e.g., quartz, glass or plastic (e.g., polyester, polymethyl methacrylate, polycarbonate or polysulfone), formed into a film, sheet or the like.

The lower electrode 2 formed on the board 1 worked as the anode in EXAMPLE 1. It can be made of a transparent, electroconductive material, e.g., indium tin oxide (ITO) or $SnO_2$, or around 50 nm thick gold (Au), formed by sputtering, EB vapor deposition or the like on one side of the board 1.

The light-emitting unit 3 was formed on the lower electrode 2. FIG. 3 is a cross-sectional view of the light-emitting unit 3. It comprised the hole transport layer 10, blue-emitting layer 11, green-emitting layer 12 and electron transport layer 13.

The hole transport layer 10 for the light-emitting unit 3 was formed to a thickness of 50 nm by vacuum deposition of 4,4-bis[N-(1-naphthyl)-N-phenylamino]biphenyl ($\alpha$-NPD), where about 60 mg of $\alpha$-NPD, put in a sublimation boat of molybdenum, was deposited at a rate controlled at 0.15±0.05 nm/second. It was patterned with the aid of a shadow mask.

The blue-emitting layer 11 for the light-emitting unit 3 was formed to a thickness of 40 nm by vacuum deposition of a distyrylarylene derivative (DPVBi), where about 40 mg of a starting material for DPVBi, put in a sublimation boat of molybdenum, was deposited at a rate controlled at 0.40±0.05 nm/second. It was patterned with the aid of a shadow mask.

The green-emitting layer 12 for the light-emitting unit 3 was formed to a thickness of 20 nm by vacuum deposition of tris(8-quinolinol)aluminum (Alq) and quinacridone (Qc) codeposited simultaneously, where about 40 mg of a starting material for Alq and 10 mg of a starting material for Qc, each put in a sublimation boat of molybdenum, were deposited at a rate controlled at 0.40±0.05 and 0.01±0.005 nm/second, respectively.

It was patterned with the aid of a shadow mask. The codeposited Alq/Qc film worked as the green-emitting layer.

The electron transport layer 13 for the light-emitting unit 3 was formed to a thickness of 20 nm by vacuum deposition of Alq, where about 40 mg of a starting material for Alq, put in a sublimation boat of molybdenum, was deposited at a rate controlled at 0.15±0.05 nm/second. It was patterned with the aid of a shadow mask.

The charge-generating layer 4 was formed on the light-emitting unit 3 prepared above to a thickness of 10 nm by vacuum deposition of $V_2O_5$ (vanadium pentaoxide), where about 40 mg of $V_2O_5$, put in a sublimation boat of molybdenum, was deposited at a rate controlled at 0.15±0.05 nm/second. It was patterned with the aid of a shadow mask.

The light-emitting unit 5 was formed on the charge-generating layer 4. FIG. 4 is a cross-sectional view of the light-emitting unit 5. It comprised the hole transport layer 14, red-emitting layer 15 and electron transport layer 16.

The hole transport layer 14 for the light-emitting unit 5 was formed to a thickness of 50 nm by vacuum deposition of $\alpha$-NPD, where about 60 mg of $\alpha$-NPD, put in a sublimation boat of molybdenum, was deposited at a rate controlled at 0.15±0.05 nm/second. It was patterned with the aid of a shadow mask.

The red-emitting layer 15 for the light-emitting unit 5 was formed to a thickness of 40 nm by vacuum deposition of Alq and Nile Red (Nr) codeposited simultaneously, where about 10 mg of a starting material for Alq and 5 mg of starting material for Nr, each put in a sublimation boat of molybdenum, were deposited at a rate controlled at 0.40±0.05 and 0.01±0.005 nm/second, respectively. It was patterned with the aid of a shadow mask.

The electron transport layer 16 for the light-emitting unit 5 was formed to a thickness of 20 nm by vacuum deposition of Alq, where about 40 mg of a starting material for Alq, put in a sublimation boat of molybdenum, was deposited at a rate controlled at 0.15±0.05 nm/second. It was patterned with the aid of a shadow mask.

The upper electrode 6 was formed on the light-emitting unit 5 prepared above, where about 10 mg of Al and 5 mg of a starting material for LiF, each put in a sublimation boat of molybdenum, were deposited in such a way to form the 0.5 nm thick LiF film first at a rate controlled at 0.01±0.005 nm/second and then 100 nm thick Al film at a rate controlled at 10.0±0.05 nm/second. It was patterned with the aid of a shadow mask.

The organic light-emitting element illustrated in FIG. 1 emits light, blue and green light by the light-emitting unit 3 and red light by the light-emitting unit 5, when a voltage V is applied to between the lower electrode 2 and upper electrode 6 to allow a current I to pass through the element. As a result, the organic light-emitting element can emit white light, because these colors are mixed with each other. The element prepared in EXAMPLE 1 emits light from the board 1 side.

The charge-generating layer 4 placed between the light-emitting units 3 and 5 may be an electrically insulating layer having a resistivity of $1.0 \times 10^2 \Omega \cdot cm$ or more. When energized with a given voltage applied to the organic light-emitting element illustrated in FIG. 1 incorporated with the charge-generating layer 4, it works to inject holes towards the cathode and electrons towards the anode. As a result, it actually provides the electrical circuit which electrically connects the light-emitting units 3 and 5 to each other in series, although it is electrically insulating.

A current I flows through the organic light-emitting element illustrated in FIG. 1, and the light-emitting unit 5 needs the same quantity of current to emit red light. The current I needed by the light-emitting unit 5 to emit red light is given by the formula I=Ib+Ig, where Ib and Ig are currents needed by the light-emitting unit 3 to emit blue and green light, respectively. Luminance L of light emitted by the organic EL element illustrated in FIG. 1 can be given by the formula L=I$\alpha$r+Ib$\alpha$b+Ig$\alpha$g, where $\alpha$r is light-emitting efficiency of the light-emitting unit 5, and $\alpha$b and $\alpha$g are those of the light-emitting unit 3 for blue and green light, respectively. Knowing that the current I which is needed by the light-emitting unit 5 to emit red light is given by the formula I=Ib+Ig, a larger quantity of current passes through the red-emitting layer 15 for the light-emitting unit 5 than that needed by the light-emitting unit 3 to emit blue light, and also than that needed to emit green light. As a result, the red-emitting layer 15 for the light-emitting unit 5 comes to exhibit a high luminance for its low light-emitting efficiency. The current Ib needed to emit blue light is almost the same as the current Ig needed to emit green light. Therefore, a current almost twice as much as the current needed to emit blue or green light passes through the red-emitting layer 15. In other words, the R/G/B ratio of the current passing through the organic light-emitting element illustrated in FIG. 1 is 2/1/1. When the R/B/G ratio of light-emitting efficiency is 3 cd/A:12 cd/A:6 cd/A, for example, the luminance ratio R/B/G of the organic light-emitting element illustrated in FIG. 1 is 6/12/6 (i.e., 1/2/1), because luminance is a product of current and light-emitting efficiency. Therefore, the element can emit common white light. Thus, the organic light-emitting element illustrated in FIG. 1, prepared in EXAMPLE 1, can emit white light of common luminance ratio without deteriorating light-emitting efficiency of green and blue light. Therefore, the present invention can provide an organic element of high efficiency for emitting white light, and hence provide an organic light-emitting display of high efficiency.

As illustrated in FIG. 1, EXAMPLE 1 describes the light-emitting unit 3 provided on the board 1 side and light-emitting unit 5 provided on the upper electrode 6 side. However, the structure with the light-emitting unit 3 provided on the upper electrode 6 side and light-emitting unit 5 provided on the lower electrode 2 side can produce the effect of the present invention. It should be noted, however, light of shorter wavelength is generally absorbed more easily and hence lower in transmittance. Therefore, it is more advantageous for efficiency of the organic light-emitting element prepared in EXAMPLE 1 to arrange the light-emitting layer having a shorter peak emitted light wavelength on the light-emitting side in the light-emitting layer for the present invention. More specifically, it is more advantageous to arrange the blue- and green-emitting layers in the light-emitting unit 3 for the present invention, illustrated in FIG. 1.

All of the light-emitting materials used for the red(R)-, green(G)- and blue(B)-emitting layers for the organic light-emitting element prepared in EXAMPLE 1 were singlet. The peak emitted light wavelengths for the element prepared in EXAMPLE 1 were within a range from 605 to 700 nm for red, from 500 to 560 nm for green and from 435 to 480 nm for blue. The light-emitting unit 3 for the organic light-emitting element prepared in EXAMPLE 1 comprised the hole transport layer 10, blue-emitting layer 11, green-emitting layer 12 and electron transport layer 13, formed in this order, as illustrated in FIG. 3. However, the order of the hole transport layer 10, green-emitting layer 12, blue-emitting layer 11 and electron transport layer 13 can produce the similar effect realized in EXAMPLE 1. Number of the light-emitting layers for the light-emitting unit 3 emitting a plurality of colors, described in EXAMPLE 1, is not limited to 2. EXAMPLE 1 also describes white light having an R/G/B luminance ratio of 1/2/1. The luminance ratio, however, is not limited to the above. For example, white light can be produced even at a luminance ratio of 3/6/1 depending on light-emitting efficiency ratio with which it is used.

EXAMPLE 2

Figure 5:
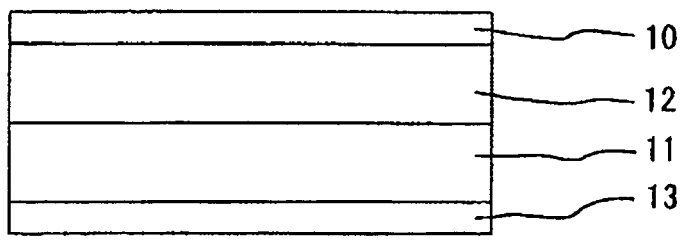
FIG. 5 is a cross-sectional view of the light-emitting unit 3 for the organic light-emitting element prepared in EXAMPLE 2.
Figure 6:
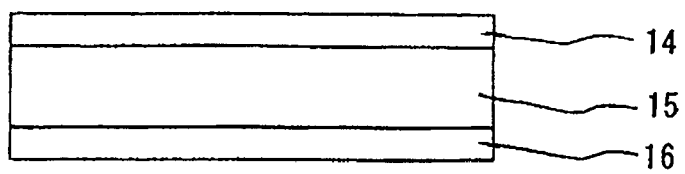
FIG. 6 is a cross-sectional view of the light-emitting unit 5 for the organic light-emitting element prepared in EXAMPLE 2.

This embodiment relates to an organic light-emitting element, illustrated in FIG. 1, structured to emit light from the upper electrode 6 side, and is described by referring to FIGS. 1, 5 and 6. FIG. 1 is a cross-sectional view of the organic light-emitting element of this embodiment. The element comprises the board 1 which supports the lower electrode 2, light-emitting unit 3, charge-generating layer 4, light-emitting unit 5 and upper electrode 6, wherein the charge-generating layer 4 is provided between the light-emitting units 3 and 5.

The board 1 can be made of a transparent material, e.g., quartz, glass or plastic (e.g., polyester, polymethyl methacrylate, polycarbonate or polysulfone), formed into a film, sheet or the like.

The lower electrode 2 worked as the cathode in EXAMPLE 2. It was formed on the board 1, where about 10 mg of Al and 5 mg of a starting material for LiF, each put in a sublimation boat of molybdenum, were deposited in such a way to form the 100 nm thick Al film first at a rate controlled at 10.0±0.05 nm/second and then 0.5 nm thick LiF film at a rate controlled at 0.01±0.005 nm/second. It was patterned with the aid of a shadow mask.

The light-emitting unit 3 was formed on the lower electrode 2. FIG. 3 is a cross-sectional view of the light-emitting unit 3. It comprised the electron transport layer 13, blue-emitting layer 11, green-emitting layer 12 and hole transport layer 10.

The electron transport layer 13 for the light-emitting unit 3 was formed to a thickness of 20 nm by vacuum deposition of Alq, where about 40 mg of a starting material for Alq, put in a sublimation boat of molybdenum, was deposited at a rate controlled at 0.15±0.05 nm/second. It was patterned with the aid of a shadow mask.

The blue-emitting layer 11 for the light-emitting unit 3 was formed to a thickness of 40 nm by vacuum deposition of a distyrylarylene derivative (DPVBi), where about 40 mg of a starting material for DPVBI, put in a sublimation boat of molybdenum, was deposited at a rate controlled at 0.40±0.05 nm/second. It was patterned with the aid of a shadow mask.

The green-emitting layer 12 for the light-emitting unit 3 was formed to a thickness of 20 nm by vacuum deposition of tris(8-quinolinol)aluminum (Alq) and quinacridone (Qc) codeposited simultaneously, where about 40 mg of a starting material for Alq and 10 mg of a starting material for Qc, each put in a sublimation boat of molybdenum, were deposited at a rate controlled at 0.40±0.05 and 0.01±0.005 nm/second, respectively. It was patterned with the aid of a shadow mask. The codeposited Alq/Qc film worked as the green-emitting layer.

The hole transport layer 10 for the light-emitting unit 3 was formed to a thickness of 50 nm by vacuum deposition of α-NPD, where about 60 mg of α-NPD, put in a sublimation boat of molybdenum, was deposited at a rate controlled at 0.15±0.05 nm/second. It was patterned with the aid of a shadow mask.

The charge-generating layer 4 was formed on the light-emitting unit 3 prepared above to a thickness of 10 nm by vacuum deposition of $V_2O_5$ (vanadium pentaoxide), where about 40 mg of $V_2O_5$, put in a sublimation boat of molybdenum, was deposited at a rate controlled at 0.15±0.05 nm/second. It was patterned with the aid of a shadow mask.

The light-emitting unit 5 was formed on the charge-generating layer 4. FIG. 6 is a cross-sectional view of the light-emitting unit 5. It comprised the electron transport layer 16, red-emitting layer 15 and hole transport layer 14.

The electron transport layer 16 for the light-emitting unit 5 was formed to a thickness of 20 nm by vacuum deposition of Alq, where about 40 mg of a starting material for Alq, put in a sublimation boat of molybdenum, was deposited at a rate controlled at 0.15±0.05 nm/second. It was patterned with the aid of a shadow mask.

The red-emitting layer 15 for the light-emitting unit 5 was formed to a thickness of 40 nm by vacuum deposition of Alq and Nile Red (Nr) codeposited simultaneously, where about 10 mg of a starting material for Alq and 5 mg of a starting material for Nr, each put in a sublimation boat of molybdenum, were deposited at a rate controlled at 0.40±0.05 and 0.01±0.005 nm/second, respectively. It was patterned with the aid of a shadow mask.

The hole transport layer 14 for the light-emitting unit 5 was formed to a thickness of 50 nm by vacuum deposition of α-NPD, where about 60 mg of α-NPD, put in a sublimation boat of molybdenum, was deposited at a rate controlled at 0.15±0.05 nm/second. It was patterned with the aid of a shadow mask.

Next, a 50 nm thick In—Zn—O (IZO) film was formed by sputtering. This film worked as the second electrode 125 and was amorphous. The sputtering was carried out under conditions of atmosphere: $Ar/O_2$ mixed gas, degree of vacuum: 0.2 Pa and sputtering output: $2\ W/cm^2$, with In/(In+Zn) (=0.83) as the target. The resulting upper electrode 6 of Mg/Ag/In—Zn—O laminated film worked as the anode and had a transmittance of 65%.

The organic light-emitting element illustrated in FIG. 1 emits light, blue and green light by the light-emitting unit 3 and red light by the light-emitting unit 5, when a voltage V is applied to between the lower electrode 2 and upper electrode 6 to allow a current I to pass through the element. As a result, the organic light-emitting element can emit white light, because these colors are mixed with each other. The element prepared in EXAMPLE 2 emits light from the upper electrode 6 side.

The charge-generating layer 4 placed between the light-emitting units 3 and 5 may be an electrically insulating layer having a resistivity of $1.0 \times 10^2\ \Omega \cdot cm$ or more. When energized with a given voltage applied to the organic light-emitting element illustrated in FIG. 1 incorporated with the charge-generating layer 4, it works to inject holes towards the cathode and electrons towards the anode. As a result, it actually provides the electrical circuit which electrically connects the light-emitting units 3 and 5 for the organic EL element illustrated in FIG. 1 to each other in series, although it is electrically insulating.

A current I flows through the organic light-emitting element illustrated in FIG. 1, and the light-emitting unit 5 needs the same quantity of current to emit red light. The current I needed by the light-emitting unit 5 to emit red light is given by the formula $I = I_b + I_g$, where $I_b$ and $I_g$ are currents needed by the light-emitting unit 3 to emit blue and green light, respectively. Luminance L of light emitted by the organic EL element illustrated in FIG. 1 can be given by the formula $L = I\alpha_r + I_b\alpha_b + I_g\alpha_g$, where $\alpha_r$ is light-emitting efficiency of the light-emitting unit 5, and $\alpha_b$ and $\alpha_g$ are those of the light-emitting unit 3 for blue and green light, respectively. Knowing that the current I which is needed by the light-emitting unit 5 to emit red light is given by the formula $I = I_b + I_g$, a larger quantity of current passes through the red-emitting layer for the light-emitting unit 5 than that needed by the light-emitting unit 3 to emit blue light, and also than that needed to emit green light. As a result, the light-emitting unit 5 emitting red light comes to exhibit a high luminance for its low light-emitting efficiency. The current $I_b$ needed to emit blue light is almost the same as the current $I_g$ needed to emit green light. Therefore, a current almost twice as much as the current needed to emit blue or green light passes through the light-emitting unit 5 for emitting red light. In other words, the R/G/B ratio of the current passing through the organic light-emitting element illustrated in FIG. 1 is 2/1/1. When the R/B/G ratio of light-emitting efficiency is 3 cd/A: 12 cd/A: 6 cd/A, for example, the luminance ratio R/B/G of the organic light-emitting element illustrated in FIG. 1 is 6/12/6 (i.e., 1/2/1), because luminance is a product of current and light-emitting efficiency. Therefore, the element can emit common white light. Thus, the organic light-emitting element illustrated in FIG. 1, prepared in EXAMPLE 2, can emit white light of common luminance ratio without deteriorating light-emitting efficiency of green and blue light. Therefore, the present invention can provide an organic element of high efficiency for emitting white light, and hence provide an organic light-emitting display of high efficiency. Moreover, the organic light-emitting element prepared in EXAMPLE 2 has a function of emitting light from the upper electrode 6 side, and hence can provide an organic light-emitting display having a higher aperture ratio than that prepared in EXAMPLE 1.

As illustrated in FIG. 1, EXAMPLE 2 describes the light-emitting unit 3 provided on the board 1 side and light-emitting unit 5 provided on the upper electrode 6 side. However, the structure with the light-emitting unit 3 provided on the upper electrode 6 side and light-emitting unit 5 provided on the board 1 side can produce the similar effect.

All of the light-emitting materials used for the red-, green- and blue-emitting layers for the organic light-emitting element prepared in EXAMPLE 2 were singlet. The peak emitted light wavelengths for the element prepared in EXAMPLE 2 were within a range from 605 to 700 nm for red, from 500 to 560 nm for green and from 435 to 480 nm for blue.

The light-emitting unit 3 for the organic light-emitting element prepared in EXAMPLE 2 comprised the electron transport layer 13, blue-emitting layer 11, green-emitting layer 12 and hole transport layer 10, formed in this order, as illustrated in FIG. 5. However, the order of the electron transport layer 13, green-emitting layer 12, blue-emitting layer 11 and hole transport layer 10 can produce the similar effect realized in EXAMPLE 2. Number of the light-emitting layers for the light-emitting unit 3 emitting a plurality of colors, described in EXAMPLE 2, is not limited to 2. EXAMPLE 2 also describes white light having an R/G/B luminance ratio of 1/2/1. The luminance ratio, however, is not limited to the above. For example, white light can be produced even at a luminance ratio of 3/6/1 depending on light-emitting efficiency ratio with which it is used.

EXAMPLE 3

Figure 7:
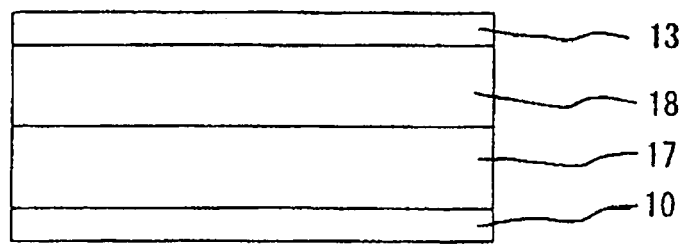
FIG. 7 is a cross-sectional view of the light-emitting unit 3 for the organic light-emitting element prepared in EXAMPLE 3.
Figure 8:
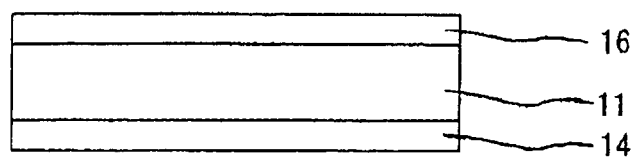
FIG. 8 is a cross-sectional view of the light-emitting unit 5 for the organic light-emitting element prepared in each of EXAMPLES 3 and 5.

This embodiment relates to an organic light-emitting element, illustrated in FIG. 1, structured to emit light from the board 1 side, and is described by referring to FIGS. 1, 7 and 8, where a triplet material (phosphorescence-emitting material) is used as a light-emitting material. FIG. 1 is a cross-sectional view of the organic light-emitting element of this embodiment. Referring to FIG. 1, the organic light-emitting element comprises the board 1 which supports the lower electrode 2, light-emitting unit 3, charge-generating layer 4, light-emitting unit 5 and upper electrode 6, wherein the charge-generating layer 4 is provided between the light-emitting units 3 and 5.

The board 1 can be made of a transparent material, e.g., quartz, glass or plastic (e.g., polyester, polymethyl methacrylate, polycarbonate or polysulfone), formed into a film, sheet or the like.

The lower electrode 2 formed on the board 1 worked as the anode in EXAMPLE 3. It can be made of a transparent, electroconductive material, e.g., indium tin oxide (ITO) or $SnO_2$, or around 50 nm thick gold (Au), formed by sputtering, EB vapor deposition or the like on one side of the board 1.

The light-emitting unit 3 was formed on the lower electrode 2. It comprised the green- and red-emitting layers, each made of a triplet material (phosphorescence-emitting material).

FIG. 7 is a cross-sectional view of the light-emitting unit 3. It comprised the hole transport layer 10, green-emitting layer 17, red-emitting layer 18 and electron transport layer 13, where each of the light-emitting layer was made of a triplet material (phosphorescence-emitting material).

The hole transport layer 10 for the light-emitting unit 3 was formed to a thickness of 50 nm by vacuum deposition of α-NPD, where about 60 mg of α-NPD, put in a sublimation boat of molybdenum, was deposited at a rate controlled at 0.15±0.05 nm/second. It was patterned with the aid of a shadow mask.

The green-emitting layer 17 of a triplet material (phosphorescence-emitting material) for the light-emitting unit 3 was formed to a thickness of 40 nm by vacuum deposition of CBP and an iridium complex (Ir(ppy)$_3$) codeposited simultaneously, where about 40 mg of a starting material for CBP and 10 mg of a starting material for Ir(ppy)$_3$, each put in a sublimation boat of molybdenum, were deposited at a rate controlled at 0.40±0.05 and 0.01±0.005 nm/second, respectively. It was patterned with the aid of a shadow mask. The codeposited CBP/(Ir(ppy)$_3$) film worked as the green-emitting layer.

The red-emitting layer 18 of a triplet material (phosphorescence-emitting material) for the light-emitting unit 3 was formed to a thickness of 40 nm by vacuum deposition of CBP and PtOEP codeposited simultaneously, where about 40 mg of a starting material for CBP and 10 mg of a starting material for PtOEP, each put in a sublimation boat of molybdenum, were deposited at a rate controlled at 0.40±0.05 and 0.01±0.005 nm/second, respectively. It was patterned with the aid of a shadow mask. The codeposited CBP/PtOEP film worked as the red-emitting layer.

The electron transport layer 13 for the light-emitting unit 3 was formed to a thickness of 20 nm by vacuum deposition of Alq, where about 40 mg of a starting material for Alq, put in a sublimation boat of molybdenum, was deposited at a rate controlled at 0.15±0.05 nm/second. It was patterned with the aid of a shadow mask.

The charge-generating layer 4 was formed on the light-emitting unit 3 prepared above to a thickness of 10 nm by vacuum deposition of V$_2$O$_5$ (vanadium pentaoxide), where about 40 mg of V$_2$O$_5$, put in a sublimation boat of molybdenum, was deposited at a rate controlled at 0.15±0.05 nm/second. It was patterned with the aid of a shadow mask.

The light-emitting unit 5 was formed on the charge-generating layer 4. FIG. 8 is a cross-sectional view of the light-emitting unit 5. It comprised the hole transport layer 14, blue-emitting layer 11 and electron transport layer 16.

The hole transport layer 14 for the light-emitting unit 5 was formed to a thickness of 50 nm by vacuum deposition of α-NPD, where about 60 mg of α-NPD, put in a sublimation boat of molybdenum, was deposited at a rate controlled at 0.15±0.05 nm/second. It was patterned with the aid of a shadow mask.

The blue-emitting layer 11 for the light-emitting unit 5 was formed to a thickness of 40 nm by vacuum deposition of a distyrylarylene derivative (DPVBi), where about 40 mg of a starting material for DPVBi, put in a sublimation boat of molybdenum, was deposited at a rate controlled at 0.40±0.05 nm/second. It was patterned with the aid of a shadow mask.

The electron transport layer 16 for the light-emitting unit 5 was formed to a thickness of 20 nm by vacuum deposition of Alq, where about 40 mg of a starting material for Alq, put in a sublimation boat of molybdenum, was deposited at a rate controlled at 0.15±0.05 nm/second. It was patterned with the aid of a shadow mask.

The upper electrode 6 was formed on the light-emitting unit 5 prepared above, where about 10 mg of Al and 5 mg of a starting material for LiF, each put in a sublimation boat of molybdenum, were deposited in such a way to form the 0.5 nm thick LiF film first at a rate controlled at 0.01±0.005 nm/second and then 100 nm thick Al film at a rate controlled at 10.0±0.05 nm/second. It was patterned with the aid of a shadow mask.

The organic light-emitting element illustrated in FIG. 1 emits light, green and red light by the light-emitting unit 3 and blue light by the light-emitting unit 5, when a voltage V is applied to between the lower electrode 2 and upper electrode 6 to allow a current I to pass through the element. As a result, the organic light-emitting element illustrated in FIG. 1 can emit white light, because these colors are mixed with each other. The charge-generating layer 4 placed between the light-emitting units 3 and 5 may be an electrically insulating layer having a resistivity of $1.0 \times 10^2 \Omega \cdot cm$ or more. When energized with a given voltage applied to the organic light-emitting element illustrated in FIG. 1 incorporated with the charge-generating layer 4, it works to inject holes towards the cathode and electrons towards the anode. As a result, it actually provides the electrical circuit which electrically connects the light-emitting units 3 and 5 to each other in series, although it is electrically insulating.

It is known that green and red light of a triplet material (phosphorescence-emitting material) generally have a higher light-emitting efficiency than blue light of a singlet material.

A current I flows through the organic light-emitting element illustrated in FIG. 1, and the light-emitting unit 5 needs the same quantity of current to emit blue light.

The current I needed by the light-emitting unit 5 to emit blue light is given by the formula I=Ig+Ir, where Ig and Ir are currents needed by the light-emitting unit 3 to emit green and red light, respectively. Luminance L of light emitted by the organic EL element illustrated in FIG. 1 can be given by the formula L=Iαb+Igαg+Irαr, where αb is light-emitting efficiency of the light-emitting unit 5, and αg and αr are those of the light-emitting unit 3 for green and red light, respectively. Knowing that the current I which is needed by the light-emitting unit 5 to emit blue light is given by the formula I=Ig+Ir, a larger quantity of current passes through the blue-emitting layer for the light-emitting unit 5 than that needed by the light-emitting unit 3 to emit green light, and also than that needed to emit red light. As a result, the blue-emitting layer for the light-emitting unit 5 comes to exhibit a high luminance for its lower light-emitting efficiency than those of the green- and red-emitting layers each of a triplet material (phosphorescence-emitting material). The current Ig needed to emit green light is almost the same as the current Ir needed to emit red light. Therefore, a current almost twice as much as the current needed to emit green or red light passes through the blue-emitting layer. In other words, the R/G/B ratio of the current passing through the organic light-emitting element illustrated in FIG. 1 is 1/1/2.

When the R/B/G ratio of light-emitting efficiency is 12 cd/A:24 cd/A:6 cd/A, for example, the luminance ratio R/B/G of the organic light-emitting element illustrated in FIG. 1 is 12/24/12 (i.e., 1/2/1), because luminance is a product of current and light-emitting efficiency. Therefore, the element can emit common white light. Thus, the organic light-emitting element illustrated in FIG. 1 can emit white light of common luminance ratio without deteriorating light-emitting efficiency of green and red light, the layer for each color being made of a triplet material (phosphorescence-emitting material) known for its high light-emitting efficiency. Therefore, the present invention can provide an organic element of high efficiency for emitting white light, and hence provide an organic light-emitting display of high efficiency. Moreover, the organic light-emitting display prepared in EXAMPLE 3 has a higher efficiency than that prepared in EXAMPLE 1, because of its structure with triplet materials (phosphorescence-emitting materials).

As illustrated in FIG. 1, EXAMPLE 3 describes the light-emitting unit 3 provided on the board 1 side and light-emitting unit 5 provided on the upper electrode 6 side. However, the structure with the light-emitting unit 3 provided on the upper electrode 6 side and light-emitting unit 5 provided on the board 1 side can produce a similar effect.

All of the light-emitting materials used for the red-, green- and blue-emitting layers for the organic light-emitting element prepared in EXAMPLE 3 were singlet. The peak-emitted light wavelengths for the element prepared in EXAMPLE 3 were within a range from 605 to 700 nm for red, from 500 to 560 nm for green and from 435 to 480 nm for blue. The light-emitting unit 3 for the organic light-emitting element prepared in EXAMPLE 3 comprised the hole transport layer 10, green-emitting layer 17 of a triplet material (phosphorescence-emitting material), red-emitting layer 18 of a triplet material (phosphorescence-emitting material) and electron transport layer 13, formed in this order, as illustrated in FIG. 7. However, the order of the hole transport layer 10, red-emitting layer 18 of a triplet material (phosphorescence-emitting material), green-emitting layer 17 of a triplet material (phosphorescence-emitting material) and electron transport layer 13 can produce the similar effect realized in EXAMPLE 3. Number of the light-emitting layers for the light-emitting unit 3 emitting a plurality of colors, described in EXAMPLE 3, is not limited to 2. EXAMPLE 3 also describes white light having an R/G/B luminance ratio of 1/2/1. The luminance ratio, however, is not limited to the above. For example, white light can be produced even at a luminance ratio of 3/6/1 depending on light-emitting efficiency ratio with which it is used.

EXAMPLE 4

Figure 9:
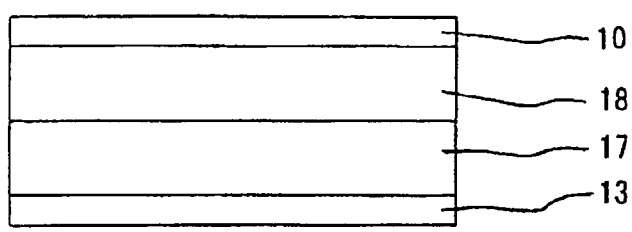
FIG. 9 is a cross-sectional view of the light-emitting unit 3 for the organic light-emitting element prepared in EXAMPLE 4.
Figure 10:
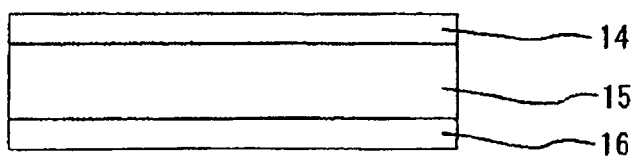
FIG. 10 is a cross-sectional view of the light-emitting unit 5 for the organic light-emitting element prepared in each of EXAMPLES 4 and 6.

This embodiment relates to an organic light-emitting element, illustrated in FIG. 1, structured to emit light from the upper electrode 6 side, and is described by referring to FIGS. 1, 9 and 10, where a triplet material (phosphorescence-emitting material) is used as a light-emitting material.

Referring to FIG. 1, the organic light-emitting element comprises the board 1 which supports the lower electrode 2, light-emitting unit 3, charge-generating layer 4, light-emitting unit 5 and upper electrode 6, wherein the charge-generating layer 4 is provided between the light-emitting units 3 and 5. The board 1 can be made of a transparent material, e.g., quartz, glass or plastic (e.g., polyester, polymethyl methacrylate, polycarbonate or polysulfone), formed into a film, sheet or the like.

The lower electrode 2 was formed on the board 1, where about 10 mg of Al and 5 mg of a starting material for LiF, each put in a sublimation boat of molybdenum, were deposited in such a way to form the 100 nm thick Al first at a rate controlled at 10.0±0.05 nm/second and then 0.5 nm thick LiF film at a rate controlled at 0.01±0.005 nm/second. It was patterned with the aid of a shadow mask.

The light-emitting unit 3 was formed on the lower electrode 2. It comprised the green- and red-emitting layers, each made of a triplet material (phosphorescence-emitting material).

FIG. 9 is a cross-sectional view of the light-emitting unit 3. It comprised the electron transport layer 13, green-emitting layer 17, red-emitting layer 18 and hole transport layer 10, where each of the light-emitting layer was made of a triplet material (phosphorescence-emitting material).

The electron transport layer 13 for the light-emitting unit 3 was formed to a thickness of 20 nm by vacuum deposition of Alq, where about 40 mg of a starting material for Alq, put in a sublimation boat of molybdenum, was deposited at a rate controlled at 0.15±0.05 nm/second. It was patterned with the aid of a shadow mask.

The green-emitting layer 17 of a triplet material (phosphorescence-emitting material) for the light-emitting unit 3 was formed to a thickness of 40 nm by vacuum deposition of CBP and an iridium complex ($Ir(ppy)_3$) codeposited simultaneously, where about 40 mg of a starting material for CBP and 10 mg of a starting material for $Ir(ppy)_3$, each put in a sublimation boat of molybdenum, were deposited at a rate controlled at 0.40±0.05 and 0.01±0.005 nm/second, respectively. It was patterned with the aid of a shadow mask. The codeposited CBP/($Ir(ppy)_3$) film worked as the green-emitting layer.

The red-emitting layer 18 of a triplet material (phosphorescence-emitting material) for the light-emitting unit 3 was formed to a thickness of 40 nm by vacuum deposition of CBP and PtOEP codeposited simultaneously, where about 40 mg of a starting material for CBP and 10 mg of a starting material for PtOEP, each put in a sublimation boat of molybdenum, were deposited at a rate controlled at 0.40±0.05 and 0.01±0.005 nm/second, respectively. It was patterned with the aid of a shadow mask. The codeposited CBP/PtOEP film worked as the red-emitting layer.

The hole transport layer 10 for the light-emitting unit 3 was formed to a thickness of 50 nm by vacuum deposition of α-NPD, where about 60 mg of α-NPD, put in a sublimation boat of molybdenum, was deposited at a rate controlled at 0.15±0.05 nm/second. It was patterned with the aid of a shadow mask.

The charge-generating layer 4 was formed on the light-emitting unit 3 prepared above to a thickness of 10 nm by vacuum deposition of $V_2O_5$ (vanadium pentaoxide), where about 40 mg of $V_2O_5$, put in a sublimation boat of molybdenum, was deposited at a rate controlled at 0.15±0.05 nm/second. It was patterned with the aid of a shadow mask.

The light-emitting unit 5 was formed on the charge-generating layer 4. FIG. 10 is a cross-sectional view of the light-emitting unit 5. It comprised the electron transport layer 16, blue-emitting layer 11 and hole transport layer 14.

The electron transport layer 16 for the light-emitting unit 5 was formed to a thickness of 20 nm by vacuum deposition of Alq, where about 40 mg of a starting material for Alq, put in a sublimation boat of molybdenum, was deposited at a rate controlled at 0.15±0.05 nm/second. It was patterned with the aid of a shadow mask.

The blue-emitting layer 11 for the light-emitting unit 5 was formed to a thickness of 40 nm by vacuum deposition of a distyrylarylene derivative (DPVBi), where about 40 mg of a starting material for DPVBI, put in a sublimation boat of molybdenum, was deposited at a rate controlled at 0.40±0.05 nm/second. It was patterned with the aid of a shadow mask.

The hole transport layer 14 for the light-emitting unit 5 was formed to a thickness of 50 nm by vacuum deposition of α-NPD, where about 60 mg of α-NPD, put in a sublimation boat of molybdenum, was deposited at a rate controlled at 0.15±0.05 nm/second. It was patterned with the aid of a shadow mask.

Next, a 50 nm thick In—Zn—O (IZO) film was formed by sputtering. This film worked as the second electrode 125 and was amorphous. The sputtering was carried out under conditions of atmosphere: $Ar/O_2$ mixed gas, degree of vacuum: 0.2 Pa and sputtering output: 2 $W/cm^2$, with In/(In+Zn) (=0.83)

as the target. The resulting upper electrode 6 of Mg/Ag/In—Zn—O laminated film worked as the anode and had a transmittance of 65%.

The organic light-emitting element illustrated in FIG. 1 emits light, green and red light by the light-emitting unit 3 and blue light by the light-emitting unit 5, when a voltage V is applied to between the lower electrode 2 and upper electrode 6 to allow a current I to pass through the element. As a result, the organic light-emitting element illustrated in FIG. 1 can emit white light, because these colors are mixed with each other.

The charge-generating layer 4 placed between the light-emitting units 3 and 5 may be an electrically insulating layer having a resistivity of $1.0 \times 10^2$ Ω·cm or more. When energized with a given voltage applied to the organic light-emitting element illustrated in FIG. 1 incorporated with the charge-generating layer 4, it works to inject holes towards the cathode and electrons towards the anode. As a result, it actually provides the electrical circuit which electrically connects the light-emitting units 3 and 5 to each other in series, although it is electrically insulating.

It is known that green and red light of a triplet material (phosphorescence-emitting material) generally have a higher light-emitting efficiency than blue light of a singlet material.

A current I flows through the organic light-emitting element illustrated in FIG. 1, and the light-emitting unit 5 needs the same quantity of current to emit blue light. The current I needed by the light-emitting unit 5 to emit blue light is given by the formula $I=Ig+Ir$, where $Ig$ and $Ir$ are currents needed by the light-emitting unit 3 to emit green and red light, respectively. Luminance L of light emitted by the organic EL element illustrated in FIG. 1 can be given by the formula $L=I\alpha b + Ig\alpha g + Ir\alpha r$, where $\alpha b$ is light-emitting efficiency of the light-emitting unit 5, and $\alpha g$ and $\alpha r$ are those of the light-emitting unit 3 for green and red light, respectively.

Knowing that the current I which is needed by the light-emitting unit 5 to emit blue light is given by the formula $I=Ig+Ir$, a larger quantity of current passes through the blue-emitting layer for the light-emitting unit 5 than that needed by the light-emitting unit 3 to emit green light, and also than that needed to emit red light. As a result, the blue-emitting layer for the light-emitting unit 5 comes to exhibit a high luminance for its lower light-emitting efficiency than those of the green- and red-emitting layers each of a triplet material (phosphorescence-emitting material). The current $Ig$ needed to emit green light is almost the same as the current $Ir$ needed to emit red light. Therefore, a current almost twice as much as the current needed to emit green or red light passes through the blue-emitting layer. In other words, the R/G/B ratio of the current passing through the organic light-emitting element illustrated in FIG. 1 is 1/1/2.

When the R/B/G ratio of light-emitting efficiency is 12 cd/A:24 cd/A:6 cd/A, for example, the luminance ratio R/B/G of the organic light-emitting element illustrated in FIG. 1 is 12/24/12 (i.e., 1/2/1), because luminance is a product of current and light-emitting efficiency. Therefore, the element can emit common white light. Thus, the organic light-emitting element illustrated in FIG. 1 can emit white light of common luminance ratio without deteriorating light-emitting efficiency of green and red light, the layer for each color being made of a triplet material (phosphorescence-emitting material) known for its high light-emitting efficiency. Therefore, the present invention can provide an organic element of high efficiency for emitting white light, and hence provide an organic light-emitting display of high efficiency. Moreover, the organic light-emitting element prepared in EXAMPLE 4 has a function of emitting light from the upper electrode 6 side, and hence can provide an organic light-emitting display having a higher aperture ratio than that prepared in EXAMPLE 3. As illustrated in FIG. 1, EXAMPLE 4 describes the light-emitting unit 3 provided on the board 1 side and light-emitting unit 5 provided on the upper electrode 6 side. However, the structure with the light-emitting unit 3 provided on the upper electrode 6 side and light-emitting unit 5 provided on the board 1 side can produce a similar effect. All of the light-emitting materials used for the red-, green- and blue-emitting layers for the organic light-emitting element prepared in EXAMPLE 4 were singlet. The peak emitted light wavelengths for the element prepared in EXAMPLE 4 were within a range from 605 to 700 nm for red, from 500 to 560 nm for green and from 435 to 480 nm for blue.

The light-emitting unit 3 for the organic light-emitting element prepared in EXAMPLE 4 comprised the electron transport layer 13, green-emitting layer 17 of a triplet material (phosphorescence-emitting material), red-emitting layer 18 of a triplet material (phosphorescence-emitting material) and hole transport layer 10, formed in this order, as illustrated in FIG. 9. However, the order of the electron transport layer 13, red-emitting layer 18 of a triplet material (phosphorescence-emitting material), green-emitting layer 17 of a triplet material (phosphorescence-emitting material) and hole transport layer 10 can produce the similar effect realized in EXAMPLE 3. Number of the light-emitting layers for the light-emitting unit 3 emitting a plurality of colors, described in EXAMPLE 4, is not limited to 2. EXAMPLE 4 also describes white light having an R/G/B luminance ratio of 1/2/1. The luminance ratio, however, is not limited to the above. For example, white light can be produced even at a luminance ratio of 3/6/1 depending on light-emitting efficiency ratio with which it is used.

EXAMPLE 5

Figure 11:
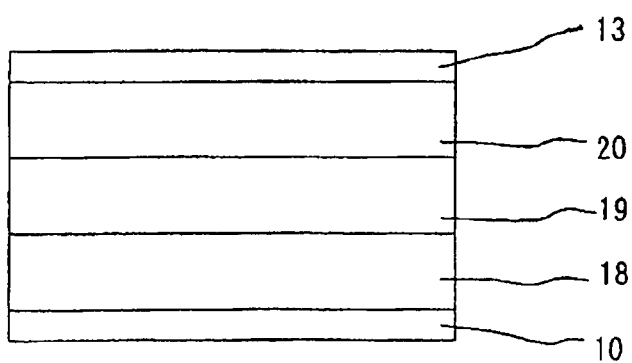
FIG. 11 is a cross-sectional view of the light-emitting unit 3 for the organic light-emitting element prepared in EXAMPLE 5.

This embodiment relates to an organic light-emitting element, illustrated in FIG. 1, structured to emit light from the board 1 side, and is described by referring to FIGS. 1, 11 and 8, where the light-emitting unit 3 has 3 light-emitting layers for each color, and the light-emitting unit 3 has one light-emitting layer whose light-emitting efficiency is equivalent to or lower than that of each of the 3 light-emitting layers for the light-emitting unit 3.

FIG. 1 is a cross-sectional view of the organic light-emitting element of this embodiment. Referring to FIG. 1, the organic light-emitting element comprises the board 1 which supports the lower electrode 2, light-emitting unit 3, charge-generating layer 4, light-emitting unit 5 and upper electrode 6, wherein the charge-generating layer 4 is provided between the light-emitting units 3 and 5.

The board 1 can be made of a transparent material, e.g., quartz, glass or plastic (e.g., polyester, polymethyl methacrylate, polycarbonate or polysulfone), formed into a film, sheet or the like.

The lower electrode 2 formed on the board 1 worked as the anode in EXAMPLE 5. It can be made of a transparent, electroconductive material, e.g., indium tin oxide (ITO) or SnO₂, or around 50 nm thick gold (Au), formed by sputtering, EB vapor deposition or the like on one side of the board 1.

The light-emitting unit 3 comprising 3 light-emitting layers for each color was formed on the lower electrode 2. FIG. 11 is a cross-sectional view of the light-emitting unit 3. It comprised the hole transport layer 10, red-emitting layer 18, green-emitting layer 19, green-emitting layer 20 and electron transport layer 13, where each of these light-emitting layers was made of a triplet material (phosphorescence-emitting material). Each of the light-emitting materials for the layers 19 and 20 had a peak emitted light wavelength of 500 nm.

The hole transport layer 10 for the light-emitting unit 3 was formed to a thickness of 50 nm by vacuum deposition of α-NPD, where about 60 mg of α-NPD, put in a sublimation boat of molybdenum, was deposited at a rate controlled at 0.15±0.05 nm/second. It was patterned with the aid of a shadow mask.

The red-emitting layer 18 of a triplet material (phosphorescence-emitting material) for the light-emitting unit 3 was formed to a thickness of 40 nm by vacuum deposition of CBP and PtOEP codeposited simultaneously, where about 40 mg of a starting material for CBP and 10 mg of a starting material for PtOEP, each put in a sublimation boat of molybdenum, were deposited at a rate controlled at 0.40±0.05 and 0.01±0.005 nm/second, respectively. It was patterned with the aid of a shadow mask. The codeposited CBP/PtOEP film worked as the red-emitting layer.

The green-emitting layer 19 of a triplet material (phosphorescence-emitting material) for the light-emitting unit 3 was formed to a thickness of 40 nm by vacuum deposition of CBP and an iridium complex (Ir(ppy)$_3$) codeposited simultaneously, where about 40 mg of a starting material for CBP and 10 mg of a starting material for Ir(ppy)$_3$, each put in a sublimation boat of molybdenum, were deposited at a rate controlled at 0.40±0.05 and 0.01±0.005 nm/second, respectively. The CBP was adjusted to have a peak emitted light wavelength of 500 nm. It was patterned with the aid of a shadow mask. The codeposited CBP/(Ir(ppy)$_3$) film worked as the green-emitting layer having a peak emitted light wavelength of 500 nm.

The green-emitting layer 20 of a triplet material (phosphorescence-emitting material) for the light-emitting unit 3 was formed to a thickness of 40 nm by vacuum deposition of CBP and an iridium complex (Ir(ppy)$_3$) codeposited simultaneously, where about 40 mg of a starting material for CBP and 10 mg of a starting material for Ir(ppy)$_3$, each put in a sublimation boat of molybdenum, were deposited at a rate controlled at 0.40±0.05 and 0.01±0.005 nm/second, respectively. The CBP was adjusted to have a peak emitted light wavelength of 540 nm. It was patterned with the aid of a shadow mask. The codeposited CBP/(Ir(ppy)$_3$) film worked as the green-emitting layer having a peak emitted light wavelength of 540 nm.

The electron transport layer 13 for the light-emitting unit 3 was formed to a thickness of 20 nm by vacuum deposition of Alq, where about 40 mg of a starting material for Alq, put in a sublimation boat of molybdenum, was deposited at a rate controlled at 0.15±0.05 nm/second. It was patterned with the aid of a shadow mask.

The order of the 3 light-emitting layers for each color for the light-emitting unit 3 is not limited to that shown in FIG. 11.

The charge-generating layer 4 was formed on the light-emitting unit 3 prepared above to a thickness of 10 nm by vacuum deposition of V$_2$O$_5$ (vanadium pentaoxide), where about 40 mg of V$_2$O$_5$, put in a sublimation boat of molybdenum, was deposited at a rate controlled at 0.15±0.05 nm/second. It was patterned with the aid of a shadow mask.

The light-emitting unit 5 was formed on the charge-generating layer 4. FIG. 8 is a cross-sectional view of the light-emitting unit 5. It comprised the hole transport layer 14, blue-emitting layer 11 and electron transport layer 16.

The hole transport layer 14 for the light-emitting unit 5 was formed to a thickness of 50 nm by vacuum deposition of α-NPD, where about 60 mg of α-NPD, put in a sublimation boat of molybdenum, was deposited at a rate controlled at 0.15±0.05 nm/second. It was patterned with the aid of a shadow mask.

The blue-emitting layer 11 for the light-emitting unit 5 was formed to a thickness of 40 nm by vacuum deposition of a distyrylarylene derivative (DPVBi), where about 40 mg of a starting material for DPVBi, put in a sublimation boat of molybdenum, was deposited at a rate controlled at 0.40±0.05 nm/second. It was patterned with the aid of a shadow mask.

The electron transport layer 16 for the light-emitting unit 5 was formed to a thickness of 20 nm by vacuum deposition of Alq, where about 40 mg of a starting material for Alq, put in a sublimation boat of molybdenum, was deposited at a rate controlled at 0.15±0.05 nm/second. It was patterned with the aid of a shadow mask.

The upper electrode 6 was formed on the light-emitting unit 5 prepared above, where about 10 mg of Al and 5 mg of a starting material for LiF, each put in a sublimation boat of molybdenum, were deposited in such a way to form the 0.5 nm thick LiF film first at a rate controlled at 0.01±0.005 nm/second and then 100 nm thick Al film at a rate controlled at 10.0±0.05 nm/second. It was patterned with the aid of a shadow mask.

The charge-generating layer 4 placed between the light-emitting units 3 and 5 may be an electrically insulating layer having a resistivity of $1.0 \times 10^2 \Omega \cdot cm$ or more. When energized with a given voltage applied to the organic light-emitting element illustrated in FIG. 1 incorporated with the charge-generating layer 4, it works to inject holes towards the cathode and electrons towards the anode. As a result, it actually provides the electrical circuit which electrically connects the light-emitting units 3 and 5 to each other in series, although it is electrically insulating.

The organic light-emitting element illustrated in FIG. 1 emits light, red light, green light (peak wavelength: 500 nm) and green light (peak wavelength: 540 nm) by the light-emitting unit 3 and blue light by the light-emitting unit 5, when a voltage V is applied to between the lower electrode 2 and upper electrode 6 in the organic light-emitting element illustrated in FIGS. 1, 11 and 8 to allow a current I to pass through the element. As a result, the organic light-emitting element illustrated in FIG. 1 can emit white light, because these colors are mixed with each other. The white light produced by the element of EXAMPLE 5 having wavelengths of 500 and 540 nm exhibits a wider color production range than that produced by red, green and blue colors. Therefore, the organic light-emitting display incorporated with the above element can produce an image of high quality. As described in EXAMPLE 3, a larger quantity of current passes through the blue-emitting layer 11 for the light-emitting unit 5 of low efficiency than that passing through each of the 3 light-emitting layers for the light-emitting unit 3. This can increase luminance of the organic light-emitting element. Therefore, EXAMPLE 5 can provide the organic light-emitting element of high light-emitting efficiency, and hence provide an organic light-emitting display of high efficiency and wide color production range.

As illustrated in FIG. 1, EXAMPLE 5 describes the light-emitting unit 3 provided on the board 1 side and light-emitting unit 5 provided on the upper electrode 6 side. However, the structure with the light-emitting unit 3 provided on the upper electrode 6 side and light-emitting unit 5 provided on the board 1 side can produce the similar effect. Number of the light-emitting layers for the light-emitting unit 3 emitting a plurality of colors, described in EXAMPLE 5, is not limited to 3.

EXAMPLE 6

Figure 12:
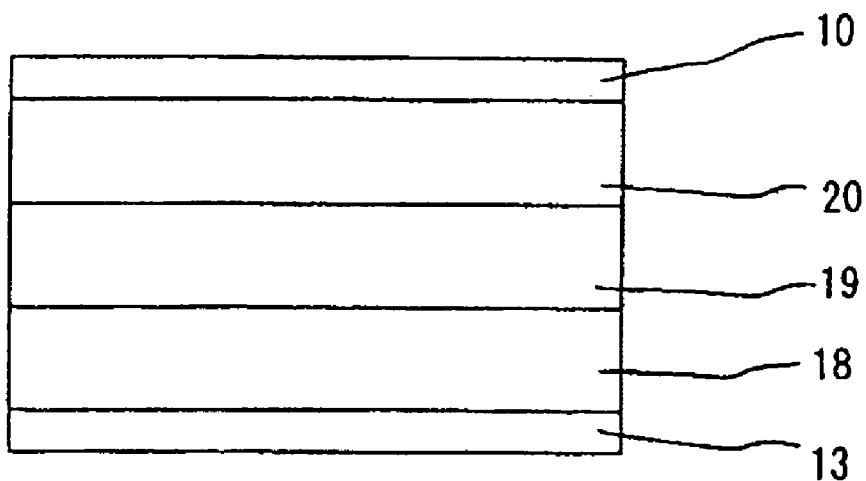
FIG. 12 is a cross-sectional view of the light-emitting unit 3 for the organic light-emitting element prepared in EXAMPLE 6.

This embodiment relates to an organic light-emitting element, illustrated in FIG. 1, structured to emit light from the upper electrode 6 side, and is described by referring to FIGS. 1, 12 and 10, where the light-emitting unit 3 has 3 light-emitting layers for each color, and the light-emitting unit 3 has one light-emitting layer whose light-emitting efficiency is lower than that of each of the 3 light-emitting layers for the light-emitting unit 3.

The board 1 can be made of a transparent material, e.g., quartz, glass or plastic (e.g., polyester, polymethyl methacrylate, polycarbonate or polysulfone), formed into a film, sheet or the like.

The lower electrode 2 was formed on the board 1, where about 10 mg of Al and 5 mg of a starting material for LiF, each put in a sublimation boat of molybdenum, were deposited in such a way to form the 100 nm thick Al film first at a rate controlled at 10.0±0.05 nm/second and then 0.5 nm thick LiF film at a rate controlled at 0.01±0.005 nm/second. It was patterned with the aid of a shadow mask.

The light-emitting unit 3 comprising 3 light-emitting layers for each color was formed on the lower electrode 2. FIG. 12 is a cross-sectional view of the light-emitting unit 3. It comprised the electron transport layer 13, red-emitting layer 18, green-emitting layer 19, green-emitting layer 20 and hole transport layer 10, where each of these light-emitting layers was made of a triplet material (phosphorescence-emitting material). The light-emitting materials for the layers 19 and 20 had a peak emitted light wavelength of 500 and 540 nm, respectively.

The electron transport layer 13 for the light-emitting unit 3 was formed to a thickness of 20 nm by vacuum deposition of Alq, where about 40 mg of a starting material for Alq, put in a sublimation boat of molybdenum, was deposited at a rate controlled at 0.15±0.05 nm/second. It was patterned with the aid of a shadow mask.

The red-emitting layer 18 of a triplet material (phosphorescence-emitting material) for the light-emitting unit 3 was formed to a thickness of 40 nm by vacuum deposition of CBP and PtOEP codeposited simultaneously, where about 40 mg of a starting material for CBP and 10 mg of a starting material for PtOEP, each put in a sublimation boat of molybdenum, were deposited at a rate controlled at 0.40±0.05 and 0.01±0.005 nm/second, respectively. It was patterned with the aid of a shadow mask. The codeposited CBP/PtOEP film worked as the red-emitting layer.

The green-emitting layer 19 of a triplet material (phosphorescence-emitting material) for the light-emitting unit 3 was formed to a thickness of 40 nm by vacuum deposition of CBP and an iridium complex (Ir(ppy)$_3$) codeposited simultaneously, where about 40 mg of a starting material for CBP and 10 mg of a starting material for Ir(ppy)$_3$, each put in a sublimation boat of molybdenum, were deposited at a rate controlled at 0.40±0.05 and 0.01±0.005 nm/second, respectively. The CBP was adjusted to have a peak emitted light wavelength of 500 nm. It was patterned with the aid of a shadow mask. The codeposited CBP/(Ir(ppy)$_3$) film worked as the green-emitting layer having a peak emitted light wavelength of 500 nm.

The green-emitting layer. 20 of a triplet material (phosphorescence-emitting material) for the light-emitting unit 3 was formed to a thickness of 40 nm by vacuum deposition of CBP and an iridium complex (Ir(ppy)$_3$) codeposited simultaneously, where about 40 mg of a starting material for CBP and 10 mg of a starting material for Ir(ppy)$_3$, each put in a sublimation boat of molybdenum, were deposited at a rate controlled at 0.40±0.05 and 0.01±0.005 nm/second, respectively. The CBP was adjusted to have a peak emitted light wavelength of 540 nm. It was patterned with the aid of a shadow mask. The codeposited CBP/(Ir(ppy)$_3$) film worked as the green-emitting layer having a peak emitted light wavelength of 540 nm. The hole transport layer 10 for the light-emitting unit 3 was formed to a thickness of 50 nm by vacuum deposition of α-NPD, where about 60 mg of α-NPD, put in a sublimation boat of molybdenum, was deposited at a rate controlled at 0.15±0.05 nm/second. It was patterned with the aid of a shadow mask. The order of the 3 light-emitting layers for each color for the light-emitting unit 3 is not limited to the above.

The charge-generating layer 4 was formed on the light-emitting unit 3 prepared above to a thickness of 10 nm by vacuum deposition of $V_2O_5$ (vanadium pentaoxide), where about 40 mg of $V_2O_5$, put in a sublimation boat of molybdenum, was deposited at a rate controlled at 0.15±0.05 nm/second. It was patterned with the aid of a shadow mask.

The light-emitting unit 5 was formed on the charge-generating layer 4. FIG. 10 is a cross-sectional view of the light-emitting unit 5. It comprised the electron transport layer 16, blue-emitting layer 11 and hole transport layer 14.

The electron transport layer 16 for the light-emitting unit 5 was formed to a thickness of 20 nm by vacuum deposition of Alq, where about 40 mg of a starting material for Alq, put in a sublimation boat of molybdenum, was deposited at a rate controlled at 0.15±0.05 nm/second. It was patterned with the aid of a shadow mask.

The blue-emitting layer 11 for the light-emitting unit 5 was formed to a thickness of 40 nm by vacuum deposition of a distyrylarylene derivative (DPVBi), where about 40 mg of a starting material for DPVBi, put in a sublimation boat of molybdenum, was deposited at a rate controlled at 0.40±0.05 nm/second. It was patterned with the aid of a shadow mask.

The hole transport layer 14 for the light-emitting unit 5 was formed to a thickness of 50 nm by vacuum deposition of α-NPD, where about 60 mg of α-NPD, put in a sublimation boat of molybdenum, was deposited at a rate controlled at 0.15±0.05 nm/second. It was patterned with the aid of a shadow mask.

Next, a 50 nm thick In-Zn-O (IZO) film was formed by sputtering. This film worked as the second electrode 125 and was amorphous. The sputtering was carried out under conditions of atmosphere: Ar/O$_2$ mixed gas, degree of vacuum: 0.2 Pa and sputtering output: 2 W/cm$^2$, with In/(In+Zn) (=0.83) as the target. The resulting upper electrode 6 of Mg/Ag/In—Zn—O laminated film worked as the anode and had a transmittance of 65%.

The charge-generating layer 4 placed between the light-emitting units 3 and 5 may be an electrically insulating layer having a resistivity of $1.0 \times 10^2 \Omega \cdot cm$ or more. When energized with a given voltage applied to the organic light-emitting element illustrated in FIG. 1 incorporated with the charge-generating layer 4, it works to inject holes towards the cathode and electrons towards the anode. As a result, it actually provides the electrical circuit which electrically connects the light-emitting units 3 and 5 to each other in series, although it is electrically insulating.

The organic light-emitting element illustrated in FIG. 1 emits light, red light, green light (peak wavelength: 500 nm) and green light (peak wavelength: 540 nm) by the light-emitting unit 3 and blue light by the light-emitting unit 5, when a voltage V is applied to between the lower electrode 2 and upper electrode 6 in the organic light-emitting element illustrated in FIGS. 1, 12 and 10 to allow a current I to pass through the element. As a result, the organic light-emitting element illustrated in FIG. 1 can emit white light, because these colors are mixed with each other. The white light produced by the element of EXAMPLE 6 having wavelengths of 500 and 540 nm exhibits a wider color production range than that produced by red, green and blue colors. Therefore, the organic light-emitting display incorporated with the above element can produce an image of high quality. As described in EXAMPLE 4, a larger quantity of current passes through the blue-emitting layer 11 for the light-emitting unit 5 of low efficiency than that passing through each of the 3 light-emitting layers for the light-emitting unit 3. This can increase luminance of the organic light-emitting element. Therefore, EXAMPLE 6 can provide the organic light-emitting element of high light-emitting efficiency, and hence provide an organic light-emitting display of high efficiency and wide color production range. Moreover, the organic light-emitting element prepared in EXAMPLE 6 has a function of emitting light from the upper electrode 6 side, and hence can provide an organic light-emitting display having a higher aperture ratio than that prepared in EXAMPLE 5.

As illustrated in FIG. 1, EXAMPLE 6 describes the light-emitting unit 3 provided on the board 1 side and light-emitting unit 5 provided on the upper electrode 6 side. However, the structure with the light-emitting unit 3 provided on the upper electrode 6 side and light-emitting unit 5 provided on the board 1 side can produce the similar effect. Number of the light-emitting layers for the light-emitting unit 3 emitting a plurality of colors, described in EXAMPLE 5, is not limited to 3.

EXAMPLE 7

Figure 13:
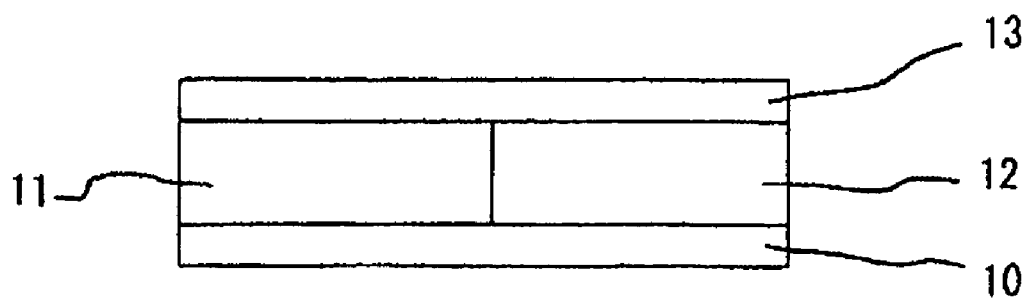
FIG. 13 is a cross-sectional view of the light-emitting unit 3 for the organic light-emitting element prepared in EXAMPLE 7.

This embodiment relates to an organic light-emitting element, illustrated in FIG. 1, structured to emit light from the board 1 side, and is described by referring to FIGS. 1, 13 and 4. It has a light-emitting unit comprising a plurality of light-emitting layers for 2 or more colors, wherein the unit is structured with the adjacent layers not laminated but laid side-by-side.

FIG. 1 is a cross-sectional view of the organic light-emitting element of this embodiment. Referring to FIG. 1, the organic light-emitting element comprises the board 1 which supports the lower electrode 2, light-emitting unit 3, charge-generating layer 4, light-emitting unit 5 and upper electrode 6, wherein the charge-generating layer 4 is provided between the light-emitting units 3 and 5.

The board 1 can be made of a transparent material, e.g., quartz, glass or plastic (e.g., polyester, polymethyl methacrylate, polycarbonate or polysulfone), formed into a film, sheet or the like.

The lower electrode 2 formed on the board 1 worked as the anode in EXAMPLE 7. It can be made of a transparent, electroconductive material, e.g., indium tin oxide (ITO) or $SnO_2$, or around 50 nm thick gold (Au), formed by sputtering, EB vapor deposition or the like on one side of the board 1.

The light-emitting unit 3 comprising light-emitting layers for blue and green colors was formed on the lower electrode 2.

FIG. 13 is a cross-sectional view of the light-emitting unit 3. It comprised the hole transport layer 10, blue-emitting layer 11, green-emitting layer 12 and electron transport layer 13, where the adjacent blue- and emitting layers are not laminated but laid side by side. These light-emitting layers have almost the same area.

The hole transport layer 10 for the light-emitting unit 3 was formed to a thickness of 50 nm by vacuum deposition of α-NPD, where about 60 mg of α-NPD, put in a sublimation boat of molybdenum, was deposited at a rate controlled at 0.15±0.05 nm/second. It was patterned with the aid of a shadow mask.

The blue-emitting layer 11 for the light-emitting unit 3 was formed to a thickness of 40 nm by vacuum deposition of a distyrylarylene derivative (DPVBi), where about 40 mg of a starting material for DPVBi, put in a sublimation boat of molybdenum, was deposited at a rate controlled at 0.40±0.05 nm/second.

The green-emitting layer 12 for the light-emitting unit 3 was formed to a thickness of 20 nm by vacuum deposition of tris(8-quinolinol)aluminum (Alq) and quinacridone (Qc) codeposited simultaneously, where about 40 mg of a starting material for Alq and 10 mg of a starting material for Qc, each put in a sublimation boat of molybdenum, were deposited at a rate controlled at 0.40±0.05 and 0.01±0.005 nm/second, respectively. It was patterned with the aid of a different shadow mask from that for forming the blue-emitting layer 11 to assure that these layers were not overlapping each other. The shadow mask for forming the blue-emitting layer 11 may be translated by a distance equivalent to the blue-emitting layer pattern. The codeposited Alq/Qc film worked as the green-emitting layer.

The electron transport layer 13 for the light-emitting unit 3 was formed to a thickness of 20 nm by vacuum deposition of Alq, where about 40 mg of a starting material for Alq, put in a sublimation boat of molybdenum, was deposited at a rate controlled at 0.15±0.05 nm/second. It was patterned with the aid of a shadow mask.

The charge-generating layer 4 was formed on the light-emitting unit 3 prepared above to a thickness of 10 nm by vacuum deposition of $V_2O_5$ (vanadium pentaoxide), where about 40 mg of $V_2O_5$, put in a sublimation boat of molybdenum, was deposited at a rate controlled at 0.15±0.05 nm/second. It was patterned with the aid of a shadow mask.

The light-emitting unit 5 was formed on the charge-generating layer 4. FIG. 4 is a cross-sectional view of the light-emitting unit 5. It comprised the hole transport layer 14, red-emitting layer 15 and electron transport layer 16.

The hole transport layer 14 for the light-emitting unit 5 was formed to a thickness of 50 nm by vacuum deposition of α-NPD, where about 60 mg of α-NPD, put in a sublimation boat of molybdenum, was deposited at a rate controlled at 0.15±0.05 nm/second. It was patterned with the aid of a shadow mask.

The red-emitting layer 15 for the light-emitting unit 5 was formed to a thickness of 40 nm by vacuum deposition of Alq and Nile Red (Nr) codeposited simultaneously, where about 10 mg of a starting material for Alq and 5 mg of a starting material for Nr, each put in a sublimation boat of molybdenum, were deposited at a rate controlled at 0.40±0.05 and 0.01±0.005 nm/second, respectively. It was patterned with the aid of a shadow mask.

The electron transport layer 16 for the light-emitting unit 5 was formed to a thickness of 20 nm by vacuum deposition of Alq, where about 40 mg of a starting material for Alq, put in a sublimation boat of molybdenum, was deposited at a rate controlled at 0.15±0.05 nm/second. It was patterned with the aid of a shadow mask.

The upper electrode 6 was formed on the light-emitting unit 5 prepared above, where about 10 mg of Al and 5 mg of a starting material for LiF, each put in a sublimation boat of molybdenum, were deposited in such a way to form the 0.5 nm thick LiF film first at a rate controlled at 0.01±0.005 nm/second and then 100 nm thick Al film at a rate controlled at 10.0±0.05 nm/second. It was patterned with the aid of a shadow mask.

The charge-generating layer 4 placed between the light-emitting units 3 and 5 may be an electrically insulating layer having a resistivity of $1.0 \times 10^2 \Omega \cdot cm$ or more. When energized with a given voltage applied to the organic light-emitting element illustrated in FIG. 1 incorporated with the charge-generating layer 4, it works to inject holes towards the cathode and electrons towards the anode. As a result, it actually provides the electrical circuit which electrically connects the light-emitting units 3 and 5 to each other in series, although it is electrically insulating.

The organic light-emitting element illustrated in FIG. 1 emits light, blue light and green light by the light-emitting unit 3 and red light by the light-emitting unit 5, when a voltage V is applied to between the lower electrode 2 and upper electrode 6 in the organic light-emitting element illustrated in FIG. 1 to allow a current I to pass through the element. As a result, the organic light-emitting element illustrated in FIG. 1 can emit white light, because these colors are mixed with each other.

A current I flows through the organic light-emitting element illustrated in FIG. 1, and the light-emitting unit 5 needs the same quantity of current to emit red light. The current I needed by the light-emitting unit 5 to emit red light is given by the formula $I=I_b+I_g$, where $I_b$ and $I_g$ are currents needed by the light-emitting unit 3 to emit blue and green light, respectively. Luminance L of light emitted by the organic EL element illustrated in FIG. 1 can be given by the formula $L=I\alpha_r+I_b\alpha_b+I_g\alpha_g$, where $\alpha_r$ is light-emitting efficiency of the light-emitting unit 5, and $\alpha_b$ and $\alpha_g$ are those of the light-emitting unit 3 for blue and green light, respectively. Knowing that the current I which is needed by the light-emitting unit 5 to emit red light is given by the formula $I=I_b+I_g$, a larger quantity of current passes through the red-emitting layer for the light-emitting unit 5 than that needed by the light-emitting unit 3 to emit blue light, and also than that needed to emit green light. As a result, the light-emitting unit 5 for emitting red light comes to exhibit a high luminance for its low light-emitting efficiency. The current $I_b$ needed to emit blue light is almost the same as the current $I_g$ needed to emit green light. Therefore, a current almost twice as much as the current needed to emit blue or green light passes through the red-emitting layer. In other words, the R/G/B ratio of the current passing through the organic light-emitting element illustrated in FIG. 1 is 2/1/1. When the R/B/G ratio of light-emitting efficiency is 3 cd/A:12 cd/A:6 cd/A, for example, the luminance ratio R/B/G of the organic light-emitting element illustrated in FIG. 1 is 6/12/6 (i.e., 1/2/1), because luminance is a product of current and light-emitting efficiency. Therefore, the element can emit common white light. Thus, the organic light-emitting element illustrated in FIG. 1 can emit white light of common luminance ratio without deteriorating light-emitting efficiency of green and blue light. Therefore, the present invention can provide an organic element of high efficiency for emitting white light, and hence provide an organic light-emitting display of high efficiency.

As illustrated in FIG. 1, EXAMPLE 7 describes the light-emitting unit 3 provided on the board 1 side and light-emitting unit 5 provided on the upper electrode 6 side. However, the structure with the light-emitting unit 3 provided on the upper electrode 6 side and light-emitting unit 5 provided on the board 1 side can produce a similar effect. All of the light-emitting materials used for the red-, green- and blue-emitting layers for the organic light-emitting element prepared in EXAMPLE 7 were singlet. The peak emitted light wavelengths for the element prepared in EXAMPLE 7 were within a range from 605 to 700 nm for red, from 500 to 560 nm for green and from 435 to 480 nm for blue. Number of the light-emitting layers for the light-emitting unit 3 emitting a plurality of colors, described in EXAMPLE 7, is not limited to 2. EXAMPLE 7 also describes the light-emitting unit 3 comprising the blue-emitting layer 11 and green-emitting layer 12 of almost the same area. However, the area ratio of these layers is not limited to the above. Moreover, the R/G/B luminance ratio of white light is not limited to 1/2/1 described in EXAMPLE 7. For example, white light can be produced even at a luminance ratio of 3/6/1 depending on light-emitting efficiency ratio with which it is used.

EXAMPLE 8

Figure 14:
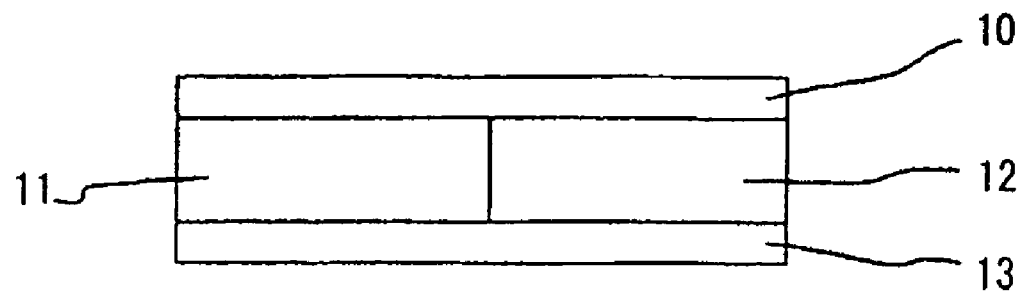
FIG. 14 is a cross-sectional view of the light-emitting unit 3 for the organic light-emitting element prepared in EXAMPLE 3.

This embodiment relates to an organic light-emitting element, illustrated in FIG. 1, structured to emit light from the upper electrode 6 side, and is described by referring to FIGS. 1, 14 and 6. It has a light-emitting unit comprising a plurality of light-emitting layers for 2 or more colors, wherein the unit is structured with the adjacent layers not laminated but laid side-by-side.

Referring to FIG. 1, the organic light-emitting element comprises the board 1 which supports the lower electrode 2, light-emitting unit 3, charge-generating layer 4, light-emitting unit 5 and upper electrode 6, wherein the charge-generating layer 4 is provided between the light-emitting units 3 and 5. The board 1 can be made of a transparent material, e.g., quartz, glass or plastic (e.g., polyester, polymethyl methacrylate, polycarbonate or polysulfone), formed into a film, sheet or the like.

The lower electrode 2 was formed on the board 1, where about 10 mg of Al and 5 mg of a starting material for LiF, each put in a sublimation boat of molybdenum, were deposited in such a way to form the 100 nm thick Al film first at a rate controlled at 10.0±0.05 nm/second and then 0.5 nm thick LiF film at a rate controlled at 0.01±0.005 nm/second. It was patterned with the aid of a shadow mask.

The light-emitting unit 3 comprising light-emitting layers for blue and green colors was formed on the lower electrode 2.

FIG. 14 is a cross-sectional view of the light-emitting unit 3. It comprised the electron transport layer 13, blue-emitting layer 11, green-emitting layer 12 and hole transport layer 10, where the adjacent blue- and emitting layers are not laminated but laid side by side.

The electron transport layer 13 for the light-emitting unit 3 was formed to a thickness of 20 nm by vacuum deposition of Alq, where about 40 mg of a starting material for Alq, put in a sublimation boat of molybdenum, was deposited at a rate controlled at 0.15±0.05 nm/second. It was patterned with the aid of a shadow mask.

The blue-emitting layer 11 for the light-emitting unit 3 was formed to a thickness of 40 nm by vacuum deposition of a distyrylarylene derivative (DPVBi), where about 40 mg of a starting material for DPVBi, put in a sublimation boat of molybdenum, was deposited at a rate controlled at 0.40±0.05 nm/second.

The green-emitting layer 12 for the light-emitting unit 3 was formed to a thickness of 20 nm by vacuum deposition of tris(8-quinolinol)aluminum (Alq) and quinacridone (Qc) codeposited simultaneously, where about 40 mg of a starting material for Alq and 10 mg of a starting material for Qc, each put in a sublimation boat of molybdenum, were deposited at a rate controlled at 0.40±0.05 and 0.01±0.005 nm/second, respectively. It was patterned with the aid of a different shadow mask from that for forming the blue-emitting layer 11 to assure that these layers were not overlapping each other. The shadow mask for forming the blue-emitting layer 11 may be translated by a distance equivalent to the blue-emitting layer pattern. The codeposited Alq/Qc film worked as the green-emitting layer.

The hole transport layer 10 for the light-emitting unit 3 was formed to a thickness of 50 nm by vacuum deposition of α-NPD, where about 60 mg of α-NPD, put in a sublimation boat of molybdenum, was deposited at a rate controlled at 0.15±0.05 nm/second. It was patterned with the aid of a shadow mask.

The charge-generating layer 4 was formed on the light-emitting unit 3 prepared above to a thickness of 10 nm by vacuum deposition of $V_2O_5$ (vanadium pentaoxide), where about 40 mg of $V_2O_5$, put in a sublimation boat of molybdenum, was deposited at a rate controlled at 0.15±0.05 nm/second. It was patterned with the aid of a shadow mask.

The light-emitting unit 5 was formed on the charge-generating layer 4. FIG. 6 is a cross-sectional view of the light-emitting unit 5. It comprised the electron transport layer 16, red-emitting layer 15 and hole transport layer 14.

The electron transport layer 16 for the light-emitting unit 5 was formed to a thickness of 20 nm by vacuum deposition of Alq, where about 40 mg of a starting material for Alq, put in a sublimation boat of molybdenum, was deposited at a rate controlled at 0.15±0.05 nm/second. It was patterned with the aid of a shadow mask.

The red-emitting layer 15 for the light-emitting unit 5 was formed to a thickness of 40 nm by vacuum deposition of Alq and Nile Red (Nr) codeposited simultaneously, where about 10 mg of a starting material for Alq and 5 mg of a starting material for Nr, each put in a sublimation boat of molybdenum, were deposited at a rate controlled at 0.40±0.05 and 0.01±0.005 nm/second, respectively. It was patterned with the aid of a shadow mask.

The hole transport layer 14 for the light-emitting unit 5 was formed to a thickness of 50 nm by vacuum deposition of α-NPD, where about 60 mg of α-NPD, put in a sublimation boat of molybdenum, was deposited at a rate controlled at 0.15±0.05 nm/second. It was patterned with the aid of a shadow mask.

Next, a 50 nm thick In-Zn-O (IZO) film was formed by sputtering. This film worked as the second electrode 125 and was amorphous. The sputtering was carried out under conditions of atmosphere: $Ar/O_2$ mixed gas, degree of vacuum: 0.2 Pa and sputtering output: 2 W/cm², with In/(In+Zn) (=0.83) as the target. The resulting upper electrode 6 of Mg/Ag/In—Zn—O laminated film worked as the anode and had a transmittance of 65%.

The charge-generating layer 4 placed between the light-emitting units 3 and 5 may be an electrically insulating layer having a resistivity of $1.0 \times 10^2$ Ω·cm or more. When energized with a given voltage applied to the organic light-emitting element illustrated in FIG. 1 incorporated with the charge-generating layer 4, it works to inject holes towards the cathode and electrons towards the anode. As a result, it actually provides the electrical circuit which electrically connects the light-emitting units 3 and 5 to each other in series, although it is electrically insulating.

The organic light-emitting element illustrated in FIG. 1 emits light, blue and green light by the light-emitting unit 3 and red light by the light-emitting unit 5, when a voltage V is applied to between the lower electrode 2 and upper electrode 6 to allow a current I to pass through the element. As a result, the organic light-emitting element can emit white light, because these colors are mixed with each other. A current I flows through the organic light-emitting element illustrated in FIG. 1, and the light-emitting unit 5 needs the same quantity of current to emit red light. The current I needed by the light-emitting unit 5 to emit red light is given by the formula I=Ib+Ig, where Ib and Ig are currents needed by the light-emitting unit 3 to emit blue and green light, respectively. Luminance L of light emitted by the organic EL element illustrated in FIG. 1 can be given by the formula L=Iαr+Ibαb+Igαg, where αr is light-emitting efficiency of the light-emitting unit 5, and αb and αg are those of the light-emitting unit 3 for blue and green light, respectively. Knowing that the current I which is needed by the light-emitting unit 5 to emit red light is given by the formula I=Ib+Ig, a larger quantity of current passes through the red-emitting layer for the light-emitting unit 5 than that needed by the light-emitting unit 3 to emit blue light, and also than that needed to emit green light. As a result, the light-emitting unit 5 for emitting red light comes to exhibit a high luminance for its low light-emitting efficiency. The current Ib needed to emit blue light is almost the same as the current Ig needed to emit green light. Therefore, a current almost twice as much as the current needed to emit blue or green light passes through the red-emitting layer. In other words, the R/G/B ratio of the current passing through the organic light-emitting element illustrated in FIG. 1 is 2/1/1. When the R/B/G ratio of light-emitting efficiency is 3 cd/A:12 cd/A:6 cd/A, for example, the luminance ratio R/B/G of the organic light-emitting element illustrated in FIG. 1 is 6/12/6 (i.e., 1/2/1), because luminance is a product of current and light-emitting efficiency. Therefore, the element can emit common white light. Thus, the organic light-emitting element illustrated in FIG. 1 can emit white light of common luminance ratio without deteriorating light-emitting efficiency of green and blue light. Therefore, the present invention can provide an organic element of high efficiency for emitting white light, and hence provide an organic light-emitting display of high efficiency. Moreover, the organic light-emitting element prepared in EXAMPLE 8 has a function of emitting light from the upper electrode 6 side, and hence can provide an organic light-emitting display having a higher aperture ratio than that prepared in EXAMPLE 7.

As illustrated in FIG. 1, EXAMPLE 8 describes the light-emitting unit 3 provided on the board 1 side and light-emitting unit 5 provided on the upper electrode 6 side. However, the structure with the light-emitting unit 3 provided on the upper electrode 6 side and light-emitting unit 5 provided on the board 1 side can produce a similar effect.

All of the light-emitting materials used for the red-, green- and blue-emitting layers for the organic light-emitting element prepared in EXAMPLE 8 were singlet. The peak emitted light wavelengths for the element prepared in EXAMPLE 8 were within a range from 605 to 700 nm for red, from 500 to 560 nm for green and from 435 to 480 nm for blue. Number of the light-emitting layers for the light-emitting unit 3 emitting a plurality of colors, described in EXAMPLE 8, is not limited to 2. EXAMPLE 8 also describes the light-emitting unit 3 comprising the blue-emitting layer 11 and green-emitting layer 12 of almost the same area. However, the area ratio of these layers is not limited to the above. Moreover, the R/G/B luminance ratio of white light is not limited to 1/2/1 described in EXAMPLE 8. For example, white light can be produced even at a luminance ratio of 3/6/1 depending on light-emitting efficiency ratio with which it is used.

EXAMPLE 9

EXAMPLE 9 describes an organic light-emitting display provided with the organic light-emitting element structured to emit light from the board 1 side, described in each of EXAMPLES 1, 3, 5 and 7, and a color filter.

Figure 15:
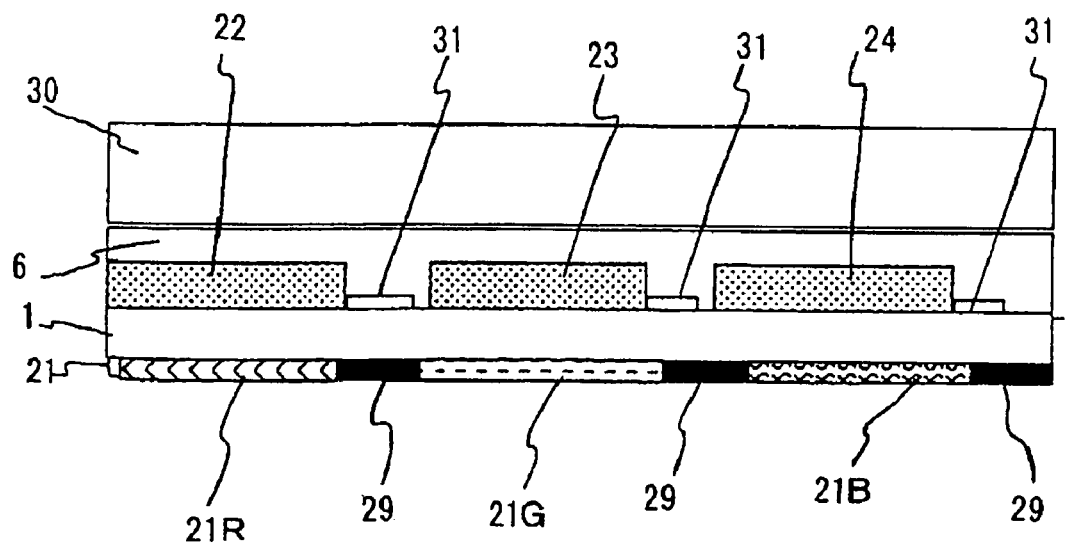
FIG. 15 is a cross-sectional view of the organic light-emitting display prepared in EXAMPLE 9.

FIG. 15 is a cross-sectional view illustrating this embodiment, where the board 1 supports the thin-film transistor (TFT) 31, and organic light-emitting elements 22, 23 and 24, described in each of EXAMPLES 1, 3, 5 and 7. Each of the organic light-emitting elements 22, 23 and 24 illustrated in FIG. 15 has the same structure as that illustrated in FIG. 1, except that the Upper electrode 6 is provided not for each element but as the common electrode for these elements, as illustrated in FIG. 15.

The TFT 31 is electrically connected to the lower electrode 2 for each of the organic light-emitting elements 22, 23 and 24, to which an electrical signal as an image signal is transmitted from the TFT 31. Each of the organic light-emitting elements 22, 23 and 24 is controlled in response to the image signal it receives for emission, stopping emission, extent of luminance, or the like. The color filter 21 provided beneath the board 1 is composed of the color filter components 21R, 21G and 21B transmitting red, green and blue light, respectively, and black matrix 29.

For preparation of the color filter 21, the black matrix 29 composed of a photosensitive resin, dispersed with metallic chromium, chromium oxide or a light-absorptive pigment, is formed by patterning on a transparent board. Then, the color filter components 21R, 21G and 21B, which selectively transmit respective red, green and blue colors while absorbing others, are provided separately from each other by a known method, e.g., dying, pigment dispersion or printing, in such a way that they are aligned with the respective organic light-emitting elements 22, 23 and 24. The transparent seal plate 30 is provided on the upper electrode 6 to protect the organic light-emitting elements 22, 23 and 24 from moisture in air or the like.

White color emitted from the organic light-emitting elements 22, 23 and 24, each controlled by an image signal from the TFT 31, turn red, green and blue after passing through the color filter components 21R, 21G and 21B, respectively. As a result, the organic light-emitting display illustrated in FIG. 15 can produce a color image. The colors from these elements are not interfered with each other on account of the black matrix 29.

The present invention can provide an organic light-emitting display capable of efficiently producing a color image by arranging the color filter in a manner illustrated in FIG. 15, because the organic light-emitting elements 22, 23 and 24 efficiently emit white color. Moreover, the same deposition mask can be used for forming the red-, green- and blue-emitting pixels, which should reduce its production cost.

When not provided with the color filter 21, the organic light-emitting display of EXAMPLE 9 can be suitably used as an illuminator, e.g., that emitting back light for a liquid-crystal display.

EXAMPLE 10

EXAMPLE 10 describes an organic light-emitting display provided with the organic light-emitting element structured to emit light from the upper electrode 6 side, described in each of EXAMPLES 2, 4, 6 and 8, and a color filter.

Figure 16:
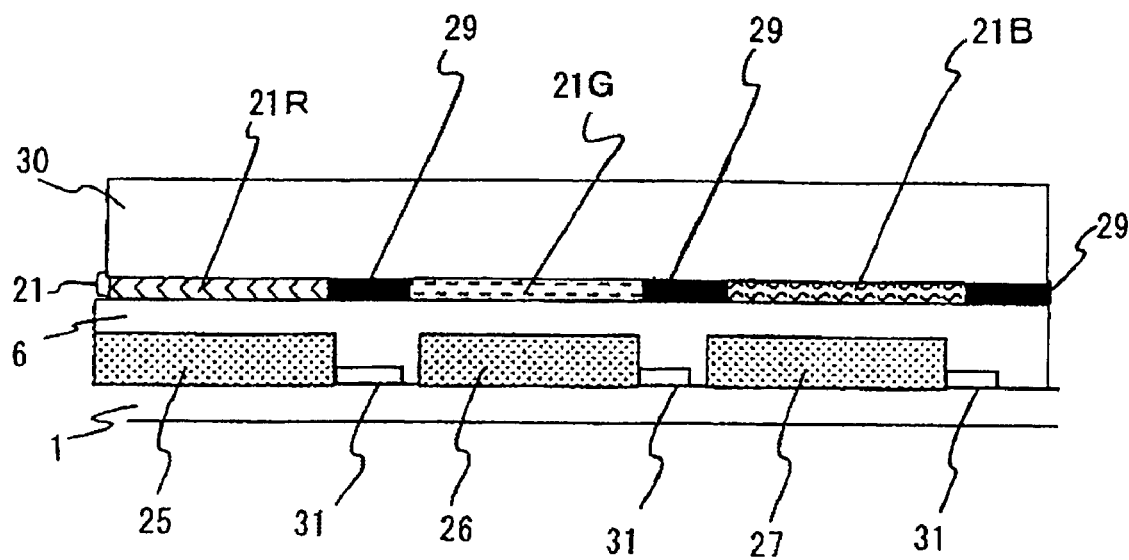
FIG. 16 is a cross-sectional view of the organic light-emitting display prepared in EXAMPLE 10.

FIG. 16 is a cross-sectional view illustrating this embodiment, where the board 1 supports the thin-film transistor (TFT) 31, and organic light-emitting elements 25, 26 and 27, described in each of EXAMPLES 2, 4, 6 and 8. Each of the organic light-emitting elements 25, 26 and 27 illustrated in FIG. 16 has the same structure as that illustrated in FIG. 1, except that the upper electrode 6 is provided not for each element but as the common electrode for these elements, as illustrated in FIG. 16.

The TFT 31 is electrically connected to the lower electrode 2 for each of the organic light-emitting elements 25, 26 and 27, to which an electrical signal as an image signal is transmitted from the TFT 31. Each of the organic light-emitting elements 25, 26 and 27 is controlled in response to the image signal it receives for emission, stopping emission, extent of luminance, or the like. The color filter 21 provided above the upper electrode 6 is composed of the color filter components 21R, 21G and 21B transmitting red, green and blue light, respectively, and black matrix 29.

For preparation of the color filter 21, the black matrix 29 composed of a photosensitive resin, dispersed with metallic chromium, chromium oxide or a light-absorptive pigment, is formed by patterning on a transparent board. Then, the color filter components 21R, 21G and 21B, which selectively transmit respective red, green and blue colors while absorbing others, are provided separately from each other by a known method, e.g., dying, pigment dispersion or printing, in such a way that they are aligned with the respective organic light-emitting elements 25, 26 and 27. The transparent seal plate 30 is provided on the color filter 21 to protect the organic light-emitting elements 25, 26 and 27 from moisture in air or the like.

White color emitted from the organic light-emitting elements 25, 26 and 27, each controlled by an image signal from the TFT 31, turn red, green and blue after passing through the color filter components 21R, 21G and 21B, respectively. As a result, the organic light-emitting display illustrated in FIG. 16 can produce a color image. These colors are prevented from interfering with beach other by the black matrix 29.

The present invention can provide an organic light-emitting display capable of efficiently producing a color image by arranging the color filter in a manner illustrated in FIG. 16, because the organic light-emitting elements 25, 26 and 27 efficiently emit white color. Moreover, the same deposition mask can be used for forming the red-, green- and blue-emitting pixels, which should reduce its production cost.

When not provided with the color filter 21, the organic light-emitting display of EXAMPLE 10 can be suitably used as an illuminator, e.g., that emitting back light for a liquid-crystal display.

EXAMPLE 11

EXAMPLE 11 describes an organic light-emitting display provided with the organic light-emitting element structured to emit light from the board 1 side, described in each of EXAMPLES 1, 3, 5 and 7, and a color-converting fluorescent material.

Figure 17:
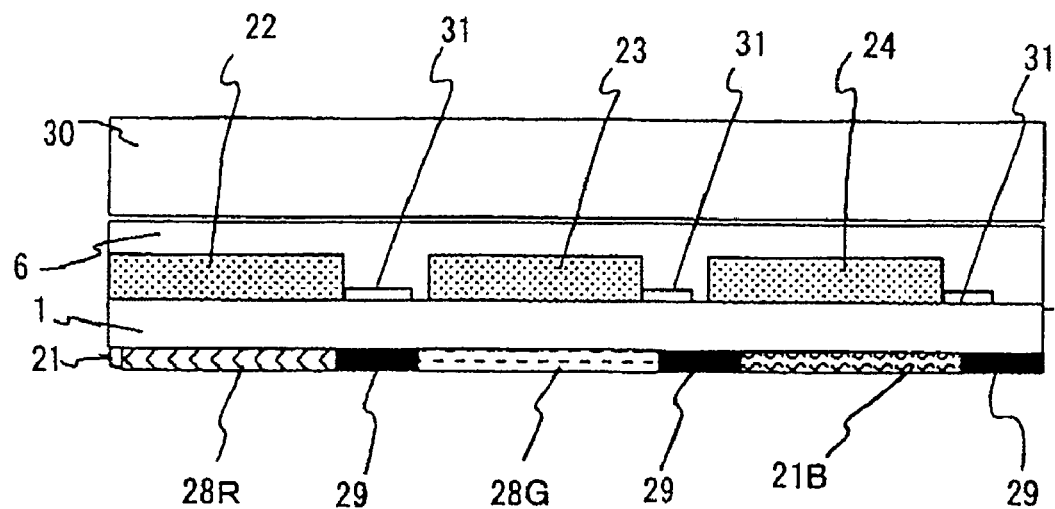
FIG. 17 is a cross-sectional view of the organic light-emitting display prepared in EXAMPLE 11.

FIG. 17 is a cross-sectional view illustrating this embodiment, where the board 1 supports the thin-film transistor (TFT) 31, and organic light-emitting elements 22, 23 and 24, described in each of EXAMPLES 1, 3, 5 and 7. Each of the organic light-emitting elements 22, 23 and 24 illustrated in FIG. 17 has the same structure as that illustrated in FIG. 1, except that the upper electrode 6 is provided not for each element but as the common electrode for these elements, as illustrated in FIG. 17.

The TFT 31 is electrically connected to the lower electrode 2 for each of the organic light-emitting elements 22, 23 and 24, to which an electrical signal as an image signal is transmitted from the TFT 31. Each of the organic light-emitting elements 22, 23 and 24 is controlled in response to the image signal it receives for emission, stopping emission, extent of luminance, or the like. The color-converting fluorescent materials 28R and 28G, color filter 21B and black matrix 29 are provided beneath the board 1 in such a way that the color-converting fluorescent materials 28R and 28G and color filter 21B are aligned with the respective organic light-emitting elements 22, 23 and 24. The color-converting fluorescent materials 28R and 28G absorb white light from the respective organic light-emitting elements 22 and 23 to emit respective red and green light.

White color emitted from the organic light-emitting elements 22 and 23, each controlled by an image signal from the TFT 31, turn red and green after being converted by the respective color-converting fluorescent materials 28R and 28G, and that from the TFT 31 turns blue after passing through the color filter component 21B. As a result, the organic light-emitting display illustrated in FIG. 17 can produce a color image. These colors are prevented from interfering with beach other by the black matrix 29.

The color-converting fluorescent material 28 may be used in combination with the color filter, described in EXAMPLE 9 or 10, for the organic light-emitting display, because it may also convert ambient light.

The present invention can provide an organic light-emitting display capable of efficiently producing a color image by arranging the color-converting fluorescent materials 28R and 28G and color filter 21B in a manner illustrated in FIG. 17, because the organic light-emitting elements 22, 23 and 24 efficiently emit white color. Moreover, the same deposition mask can be used for forming the red-, green- and blue-emitting pixels, which should reduce its production cost.

When not provided with any of the color-converting fluorescent materials 28R and 28G and color filter 21B, the organic light-emitting display of EXAMPLE 11 can be suitably used as an illuminator, e.g., that emitting back light for a liquid-crystal display.

EXAMPLE 12

EXAMPLE 12 describes an organic light-emitting display provided with the organic light-emitting element structured to emit light from the upper electrode 6 side, described in each of EXAMPLES 2, 4, 6 and 8, and a color-converting fluorescent material.

Figure 18:
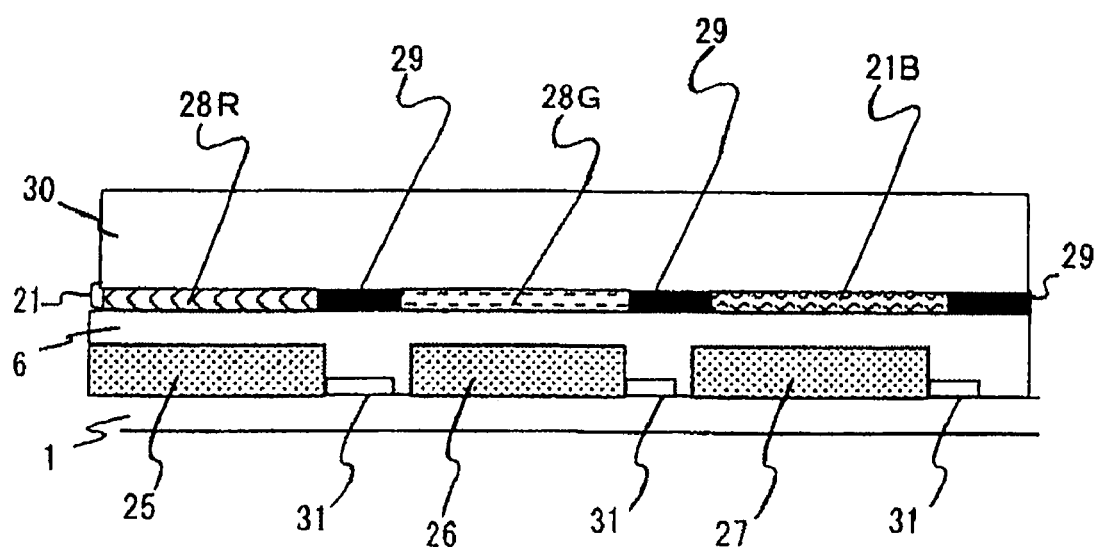
FIG. 18 is a cross-sectional view of the organic light-emitting display prepared in EXAMPLE 12.

FIG. 18 is a cross-sectional view illustrating this embodiment, where the board 1 supports the thin-film transistor (TFT) 31, and organic light-emitting elements 25, 26 and 27, described in each of EXAMPLES 2, 4, 6 and 8. Each of the organic light-emitting elements 25, 26 and 27 illustrated in FIG. 18 has the same structure as that illustrated in FIG. 1, except that the upper electrode 6 is provided not for each element but as the common electrode for these elements, as illustrated in FIG. 18.

The TFT 31 is electrically connected to the lower electrode 2 for each of the organic light-emitting elements 25, 26 and 27, to which an electrical signal as an image signal is transmitted from the TFT 31. Each of the organic light-emitting elements 25, 26 and 27 is controlled in response to the image signal it receives for emission, stopping emission, extent of luminance., or the like.

The color-converting fluorescent materials 28R and 28G, color filter 21B and black matrix 29 are provided above the upper electrode 6 in such a way that the color-converting fluorescent materials 28R and 28G and color filter 21B are aligned with the respective organic light-emitting elements 25, 26 and 27.

The color-converting fluorescent materials 28R and 28G absorb white light from the respective organic light-emitting elements 25 and 26 to emit respective red and green light.

White color emitted from the organic light-emitting elements 25 and 26, each controlled by an image signal from the TFT 31, turn red and green after being converted by the respective color-converting fluorescent materials 28R and 28G, and that from the TFT 31 turns blue after passing through the color filter 21B. As a result, the organic light-emitting display illustrated in FIG. 18 can produce a color image. These colors are prevented from interfering with beach other by the black matrix 29.

The color-converting fluorescent material 28 may be used in combination with the color filter, described in EXAMPLE 9 or 10, for the organic light-emitting display, because it may also convert ambient light.

The present invention can provide an organic light-emitting display capable of efficiently producing a color image by arranging the color-converting fluorescent materials 28R and 28G, color filter 21B and black matrix 29 in a manner illustrated in FIG. 18, because the organic light-emitting elements 25, 26 and 27 efficiently emit white color. Moreover, the same deposition mask can be used for forming the red-, green- and blue-emitting pixels, which should reduce its production cost.

When not provided with any of the color-converting fluorescent materials 28R and 28G and color filter 21B, the organic light-emitting display of EXAMPLE 12 can be suitably used as an illuminator, e.g., that emitting back light for a liquid-crystal display.

It should be further understood by those skilled in the art that although the foregoing description has been made on embodiments of the invention, the invention is not limited thereto and various changes and modifications may be made without departing from the spirit of the invention and the scope of the appended claims.

INDUSTRIAL APPLICABILITY

The present invention can provide a thin display of high efficiency for emitting spontaneous light, which is applicable to various purposes, e.g., displays for TV sets and terminals for various types of information, and illuminators.

ADVANTAGES OF THE INVENTION

The organic light-emitting element of the present invention allows a larger quantity of current to pass through a light-emitting layer of lower light-emitting efficiency than through a light-emitting layer of higher light-emitting efficiency. Therefore, the present invention can provide an organic element of high light-emitting efficiency, and hence provide an organic light-emitting display of high efficiency.

The invention claimed is:

1. An organic light-emitting element comprising:
a board, an upper electrode, a lower electrode,
a plurality of light-emitting units and
a charge-generating layer which simultaneously generates a hole and an electron, wherein
said plurality of the light-emitting units are placed between the upper electrode and the lower electrode, said plurality of the light-emitting units comprise a light-emitting unit having a layer for emitting monochromatic light and a light-emitting unit having a layer for emitting polychromatic light, and
the charge-generating layer is placed between the light-emitting unit having a layer for emitting monochromatic light and the light-emitting unit having a layer for emitting polychromatic light,
wherein one layer of the layer for emitting polychromatic light comprises plural laminated light-emitting layers and no charge-generating layer is formed among the plural laminated light-emitting layers.

2. The organic light-emitting element according to claim 1, wherein the organic light-emitting element has a specific luminance ratio for producing white light.

3. The organic light-emitting element according to claim 1, wherein the layer for emitting monochromatic light has a lower light-emitting efficiency than the layer emitting polychromatic light.

4. The organic light-emitting element according to claim 1, wherein the layer for emitting monochromatic light is composed of a blue-emitting layer of a singlet material, and the layer emitting polychromatic light is composed of a red-emitting layer of a triplet material and a green-emitting layer of a triplet material.

5. The organic light-emitting element according to claim 1, wherein the layer for emitting polychromatic light has a laminated structure composed of 2 or more light-emitting layers.

6. The organic light-emitting element according to claim 1, wherein a light radiated from the light-emitting layer is transmitted by the upper electrode and is emitted to an outside.

7. The organic light-emitting element according to claim 1, wherein the light-emitting unit having a layer for emitting polychromatic light comprises at least one green-emitting layer.

* * * * *